US012211787B2

(12) United States Patent
Wang et al.

(10) Patent No.: US 12,211,787 B2
(45) Date of Patent: Jan. 28, 2025

(54) INTERCONNECT STRUCTURES AND METHODS OF FABRICATION THEREOF

(71) Applicant: Taiwan Semiconductor Manufacturing Company, Ltd., Hsinchu (TW)

(72) Inventors: Chao-Hsun Wang, Taoyuan County (TW); Wang-Jung Hsueh, New Taipei (TW); Fu-Kai Yang, Hsinchu (TW); Mei-Yun Wang, Hsin-Chu (TW); Sheng-Hsiung Wang, Hsinchu County (TW); Shih-Hsien Huang, Yilan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/309,460

(22) Filed: Apr. 28, 2023

(65) Prior Publication Data
US 2023/0260900 A1    Aug. 17, 2023

Related U.S. Application Data

(63) Continuation of application No. 17/144,724, filed on Jan. 8, 2021, now Pat. No. 11,640,936.

(51) Int. Cl.
| H01L 23/522 | (2006.01) |
| H01L 21/321 | (2006.01) |
| H01L 21/768 | (2006.01) |
| H01L 23/528 | (2006.01) |
| H01L 23/532 | (2006.01) |
| H01L 29/40  | (2006.01) |

(52) U.S. Cl.
CPC .... *H01L 23/5226* (2013.01); *H01L 21/32115* (2013.01); *H01L 21/76802* (2013.01); *H01L 23/5283* (2013.01); *H01L 23/53257* (2013.01); *H01L 29/401* (2013.01)

(58) Field of Classification Search
CPC ............ H01L 23/5226; H01L 23/5283; H01L 21/76802; H01L 21/76816; H01L 29/401
See application file for complete search history.

(56) References Cited

U.S. PATENT DOCUMENTS 9,000,584 B2    4/2015    Lin
9,048,222 B2    6/2015    Hung
(Continued)

FOREIGN PATENT DOCUMENTS

TW        201731057 A        9/2017

*Primary Examiner* — Bac H Au
(74) *Attorney, Agent, or Firm* — HAYNES AND BOONE, LLP

(57) ABSTRACT

A semiconductor structure and the manufacturing method thereof are disclosed. An exemplary semiconductor structure includes a first source/drain contact and a second source/drain contact spaced apart by a gate structure, an etch stop layer (ESL) over the first source/drain contact and the second source/drain contact, a conductive feature disposed in the etch stop layer and in direct contact with the first source/drain contact and the second source/drain contact, a dielectric layer over the etch stop layer, and a contact via extending through the dielectric layer and electrically connected to the conductive feature. By providing the conductive feature, a number of metal lines in an interconnect structure of the semiconductor structure may be advantageously reduced.

20 Claims, 24 Drawing Sheets

(56) References Cited

U.S. PATENT DOCUMENTS

| | | |
|---|---|---|
| 9,048,233 B2 | 6/2015 | Wu |
| 9,064,879 B2 | 6/2015 | Hung |
| 9,111,949 B2 | 8/2015 | Yu |
| 9,263,511 B2 | 2/2016 | Yu |
| 9,281,254 B2 | 3/2016 | Yu |
| 9,368,460 B2 | 6/2016 | Yu |
| 9,372,206 B2 | 6/2016 | Wu |
| 9,496,189 B2 | 11/2016 | Yu |
| 10,804,401 B2 | 10/2020 | Chen |
| 10,840,189 B2 | 11/2020 | Tsai |
| 11,171,052 B2 | 11/2021 | Tien |
| 11,424,188 B2 | 8/2022 | Tsai |
| 2013/0193489 A1 | 8/2013 | Baars et al. |
| 2017/0117272 A1 | 4/2017 | Sio |
| 2017/0154848 A1 | 6/2017 | Fan |
| 2020/0006230 A1 | 1/2020 | Tsai |
| 2020/0144135 A1 | 5/2020 | Liaw |
| 2020/0161439 A1 | 5/2020 | You |
| 2021/0265264 A1 | 8/2021 | Chou |
| 2021/0367043 A1 | 11/2021 | Huang |
| 2021/0375665 A1 | 12/2021 | Cheng |
| 2021/0375753 A1 | 12/2021 | Wu |
| 2022/0262725 A1 | 8/2022 | Chou |

INTERCONNECT STRUCTURES AND METHODS OF FABRICATION THEREOF

PRIORITY DATA

This is a continuation of U.S. patent application Ser. No. 17/144,724, filed Jan. 8, 2021, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices, such as fin field-effect transistors (FinFETs) and gate-all-around (GAA) transistors, are introduced in an effort to improve gate control by increasing gate-channel coupling, reduce OFF-state current, and reduce short-channel effects (SCEs). The three-dimensional structure of the multi-gate devices, allows them to be aggressively scaled while maintaining gate control and mitigating SCEs. However, even with the introduction of multi-gate devices, aggressive scaling down of IC dimensions has resulted in densely spaced gate structures and source/drain contacts, densely spaced contact vias, and corresponding metal lines. While existing interconnect structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
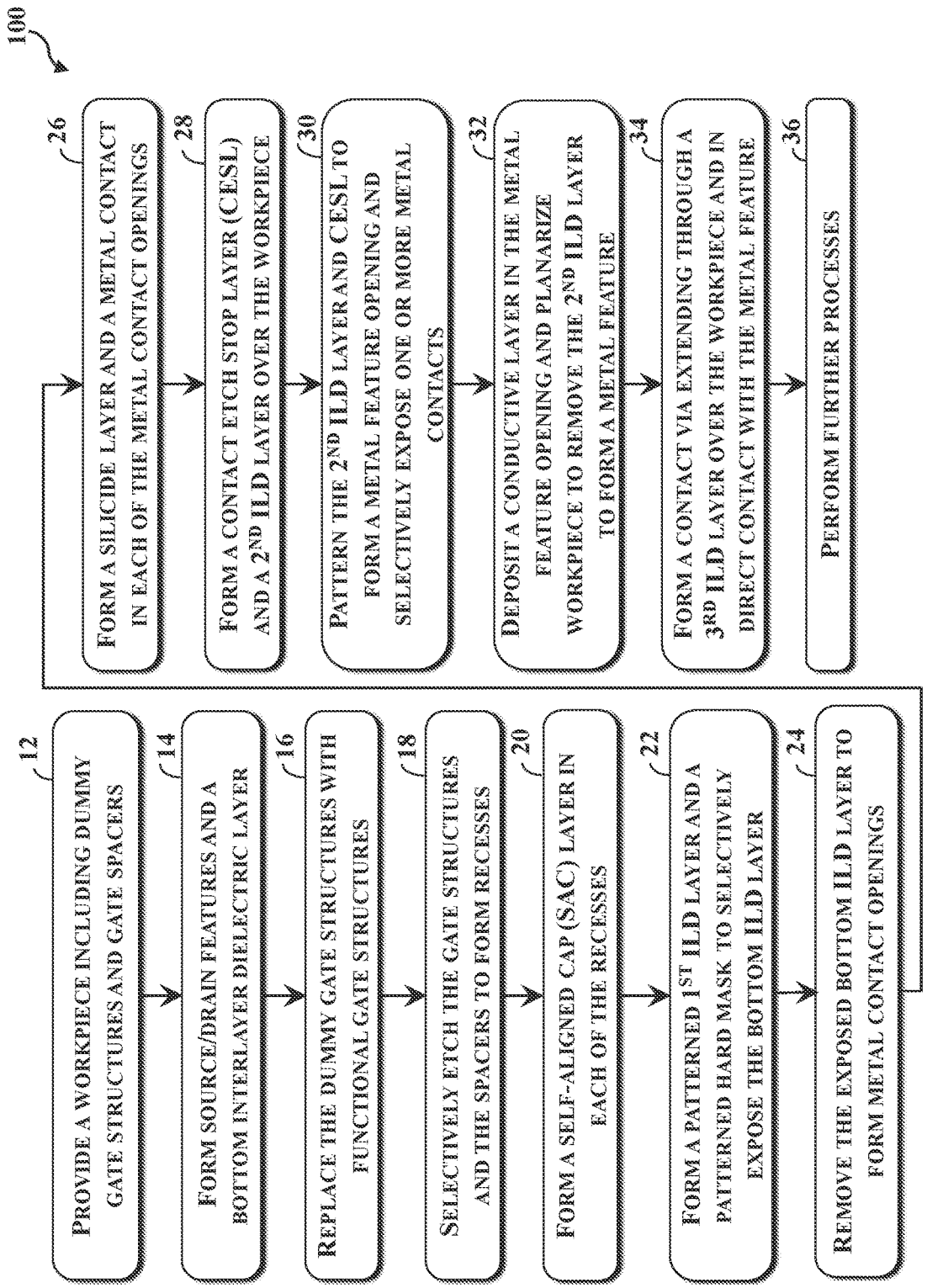
FIG. 1 illustrates a flowchart of a method of forming an exemplary interconnect structure or a portion thereof, in accordance with one or more aspects of the disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. Contacts fabricated during MEOL can be referred to as device-level contacts, metal contacts, and/or local interconnects. BEOL generally encompasses processes related to fabricating a multilayer interconnect (MLI) structure that interconnects IC features fabricated by FEOL and MEOL (referred to herein as FEOL and MEOL features or structures, respectively), thereby enabling operation of the IC devices. Often, each layer in the MLI structure (also referred to as an interconnect layer or interconnect level) includes at least one conductive feature disposed in an insulator layer, such as a metal line and a via disposed in a dielectric layer, where the via connects the metal line to a conductive feature in a different interconnect layer. Metal lines and vias of the interconnect layers can be referred to as BEOL features or global interconnects.

As described above, aggressive scaling down of IC dimensions has resulted in densely spaced transistors, which would result densely spaced MEOL features (e.g., source/drain contacts) and densely spaced BEOL features (e.g., contact vias and metal lines). The challenges in fabricating densely spaced MEOL features and BEOL features may limit further increase in transistor density. To address such limitations, some have proposed to reduce the pitch of BEOL features (e.g. metal lines) or to reduce the number of BEOL features (e.g. metal lines). However, pursuing the former may give rise to challenges in patterning and gap filling and pursuing the latter may constrain the flexibility of designing.

The present disclosure provides structures and methods for introducing a mezzanine interconnect layer between the MEOL features and the BEOL features. The additional mezzanine interconnect layer may reduce the usage of BEOL features (e.g. metal lines) and reduce the need to increase BEOL feature density. The structure of the present disclosure includes an interconnect layer including a metal feature embedded in an etch stop layer and disposed between source/drain contacts and a contact via. In an illustrative example, the metal feature extends along a direction to couple two source/drain contacts, and a top surface of the etch stop layer and that of the metal feature are coplanar. By providing this interconnect layer, the number of metal lines in an interconnect structure of the semiconductor structure may be advantageously controlled.

Figure 2:
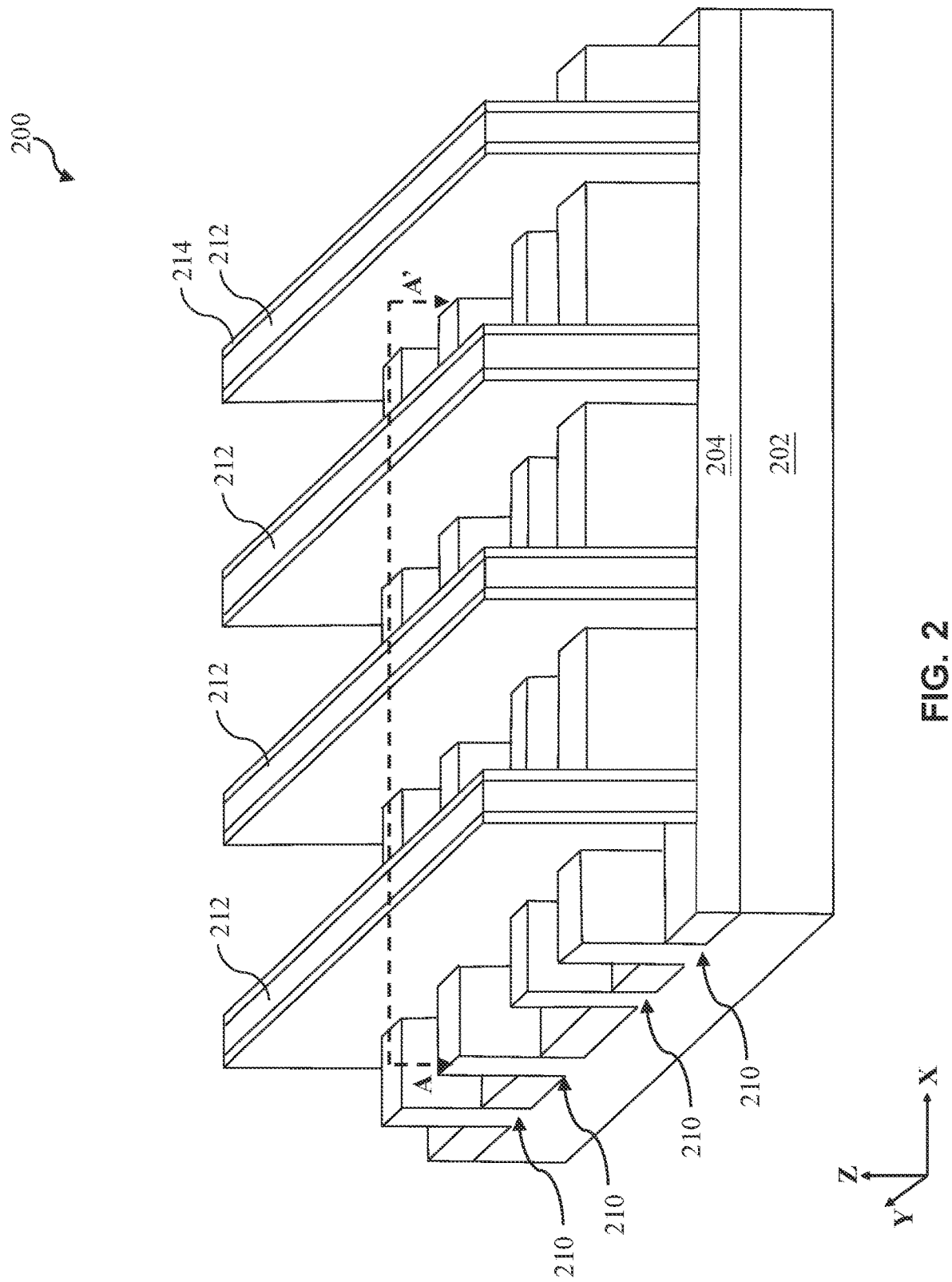
FIG. 2 illustrates a three-dimensional (3D) perspective view of an exemplary workpiece to undergo various stages of operations in the method of FIG. 1, according to various aspects of the disclosure.

The various aspects of the present disclosure will now be described in more detail with reference to the figures. In that regard, FIG. 1 is a flowchart illustrating a method 100 of forming an interconnect structure according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2-24. FIG. 2 illustrates a three-dimensional (3D) perspective view of an exemplary workpiece to undergo various stages of operations in the method of FIG. 1. FIGS. 3-24 are fragmentary cross-sectional views or fragmentary layout views of a workpiece 200 at different stages of fabrication according to embodiments of the method 100 in FIG. 1. For avoidance of doubts, the X, Y and Z directions in FIGS. 2-24 are perpendicular to one another and are used consistently throughout FIGS. 2-24. Because the workpiece 200 will be fabricated into a semiconductor device, the workpiece 200 may be referred to herein as a semiconductor device 200 as the context requires. Throughout the present disclosure, like reference numerals denote like features unless otherwise excepted.

Referring to FIGS. 1-2, method 100 includes a block 12 where a workpiece 200 is provided. The workpiece 200 includes a substrate 202 and various features formed thereon. In the depicted embodiment, the substrate 202 includes silicon. Alternatively or additionally, the substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using implantation of oxygen (SIMOX), wafer bonding, and/or other suitable methods. The substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants. An ion implantation process, a diffusion process, and/or other suitable doping process can be performed to form the various doped regions.

As shown in FIG. 2, the workpiece 200 includes a plurality of fins 210 disposed on the substrate 202. In some embodiments, the fins 210 may be formed from patterning a portion of the substrate 202. In some alternative embodiments, the fins 210 may be formed from patterning one or more epitaxial layers deposited over the substrate 202. An isolation feature 204 is formed between the fins 210 to separate adjacent fins. In some embodiments, the isolation feature 204 may include silicon oxide, silicon nitride, silicon oxynitride, fluorine-doped silicate glass (FSG), a low-k dielectric, combinations thereof, and/or other suitable materials. Method 100 is described with respect to FinFETs. It is understood that embodiments of the present disclosure may be applied to planar transistor devices and other multi-gate devices. For example, the semiconductor device 200 may include an MBC transistor and the active region may include at least one nanostructure of an MBC transistor. The active region may include silicon layers and silicon germanium layer that are alternatingly and epitaxially grown on the substrate 202 to form a layer stack. The semiconductor layer stack is then patterned to form fin-shape stacks of nanostructures. The silicon germanium layers in the channel regions of fin-shape stacks are then selectively removed to release the silicon layers into suspended nanostructures to forming a channel region.

The workpiece 200 includes dummy gate structures 212 disposed over channel regions of the fins 210. In the embodiments represented in FIG. 2, the dummy gate structures 212 wrap over channel regions of the fins 210. While not explicitly shown in the figures, each of the dummy gate structures 212 may include a dummy gate dielectric layer and a dummy gate electrode over the dummy gate dielectric. The dummy dielectric layer may include silicon oxide, the dummy gate electrode layer may include polysilicon. Sidewalls of the dummy gate structures 212 are lined with gate spacers 214. In some embodiments, the gate spacers 214 may include silicon carbonitride, silicon oxycarbide, silicon oxycarbonitride, or silicon nitride. As shown in FIG. 2, line A-A' cuts through dummy gate structures 212.

Figure 3:
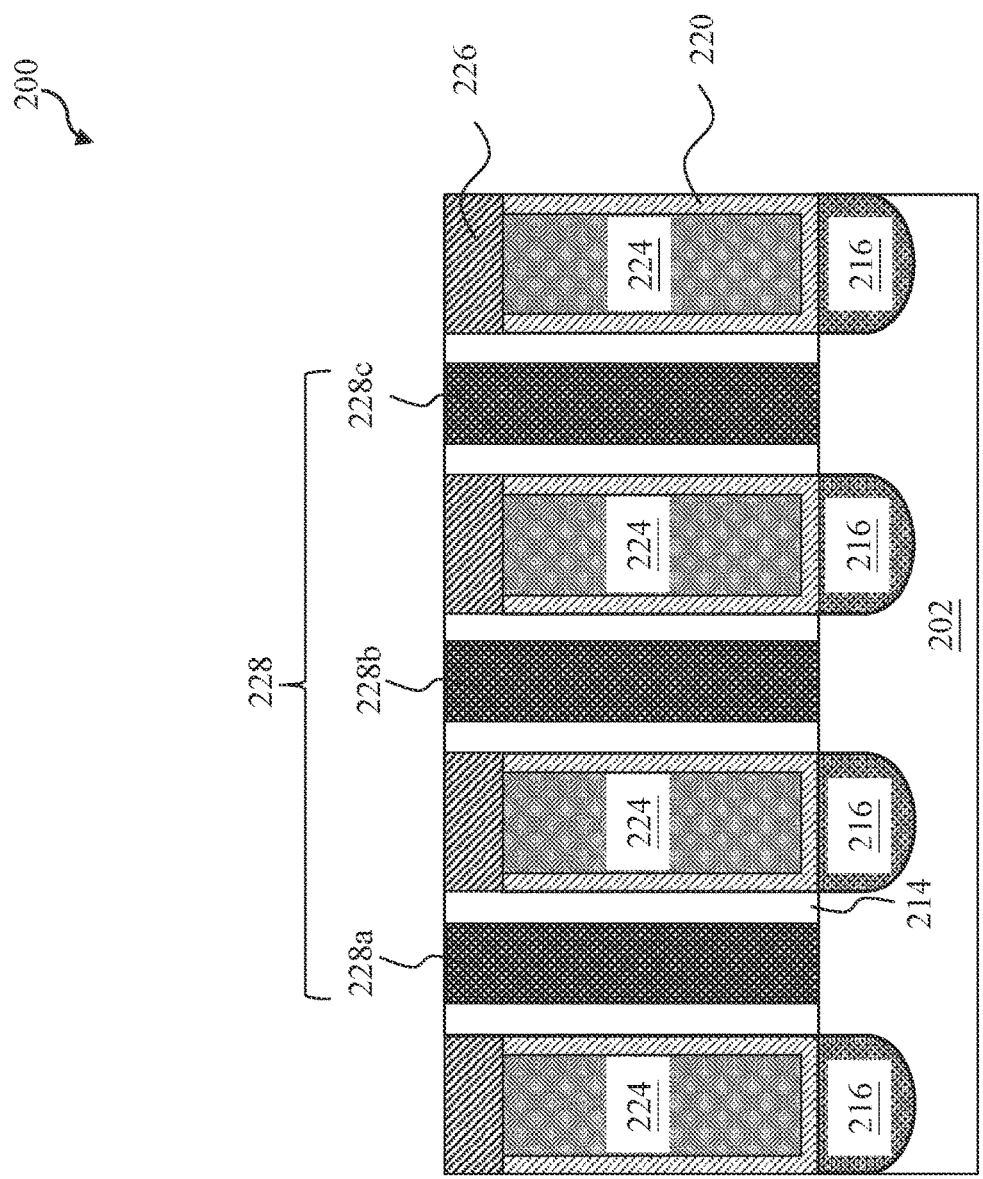
FIGS. 3-18 illustrate fragmentary cross-sectional views of a first device area of the workpiece taken along line A-A' as shown in FIG. 2 undergoing various stages of operations in the method of FIG. 1 in accordance with one or more aspects of the present disclosure.

Referring to FIGS. 1 and 3, method 100 includes a block 14 where source/drain features 216 and a bottom interlayer dielectric (ILD) layer 224 are formed. The formation of the source/drain features 216 may include various processes. For example, an anisotropic etch process may be performed to recess the source/drain regions in the fins 210 to form source/drain trenches. After formation of the source/drain trenches, an epitaxial growth process may be performed to epitaxially grow source/drain features 216 in the source/drain trenches. The source/drain features 216 may be formed vapor-phase epitaxy (VPE), ultra-high vacuum chemical vapor deposition (UHV-CVD), low pressure vapor deposition (LPCVD), and/or plasma-enhanced chemical vapor deposition (PECVD), molecular beam epitaxy (MBE), or other suitable epitaxy processes, or combinations thereof. Depending on the design of the semiconductor device 200, source/drain features 216 may be n-type or p-type. When the source/drain features 216 are n-type, they may include silicon (Si) doped with an n-type dopant, such as phosphorus (P) or arsenic (As). When the source/drain features 216 are p-type, they may include silicon germanium (SiGe) doped with a p-type dopant, such as boron (B) or gallium (Ga). In some implementations, annealing processes may be performed to activate dopants in source/drain features 216 of the semiconductor device 200.

After the formation of the source/drain features 216, a first contact etch stop layer (CESL) 220 and a bottom interlayer dielectric (ILD) layer 224 are deposited over the workpiece 200. The first CESL 220 may be deposited using atomic layer deposition (ALD), plasma-enhanced ALD (PEALD), PECVD, and/or other suitable deposition processes. The bottom ILD layer 224 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The bottom ILD layer 224 may be deposited by a CVD process, a flowable CVD (FCVD) process, a spin-on coating process, or other suitable deposition technique. In embodiments represented in FIG. 3, the workpiece 200 also includes a first hard mask layer 226 formed on the first CESL 220 and the bottom ILD layer 224. The first CESL 220 and the first hard mask layer 226 may include a silicon nitride layer, a silicon oxynitride layer, and/or other materials known in the art. In an embodiment, the first hard mask layer 226 and the first CESL 220 are both formed of silicon nitride layer.

Referring to FIGS. 1 and 3, method 100 includes a block 16 where dummy gate structures are replaced with functional gate structures. The workpiece 200 is planarized using a chemical mechanical polishing (CMP) process to expose top surfaces of the dummy gate structures 212. In this depicted example, the dummy gate structures 212 are then removed and replaced with functional gate structures 228a-228c. The functional gate structures 228a-228c may be collectively referred as functional gate structure 228. An etching process may be performed to remove the dummy gate structures 212 to form gate trenches (not explicitly shown). The etching process may include one or more iterations of various etching techniques, such as wet etching, dry etching, RIE. The forming of the functional gate structure 228 begins by forming a gate dielectric layer (not separately labeled) in the gate trench. The gate dielectric layer may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide (k≈3.9). Exemplary high-k dielectric materials for the high-k dielectric layer include hafnium oxide, titanium oxide, hafnium zirconium oxide, tantalum oxide, hafnium silicon oxide, zirconium silicon oxide, lanthanum oxide, aluminum oxide, yttrium oxide, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

A gate electrode (not separately labeled) is then formed over the gate dielectric layer. The gate electrode may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum, copper, tungsten, ruthenium, titanium, a suitable metal, or a combination thereof.

Figure 4:
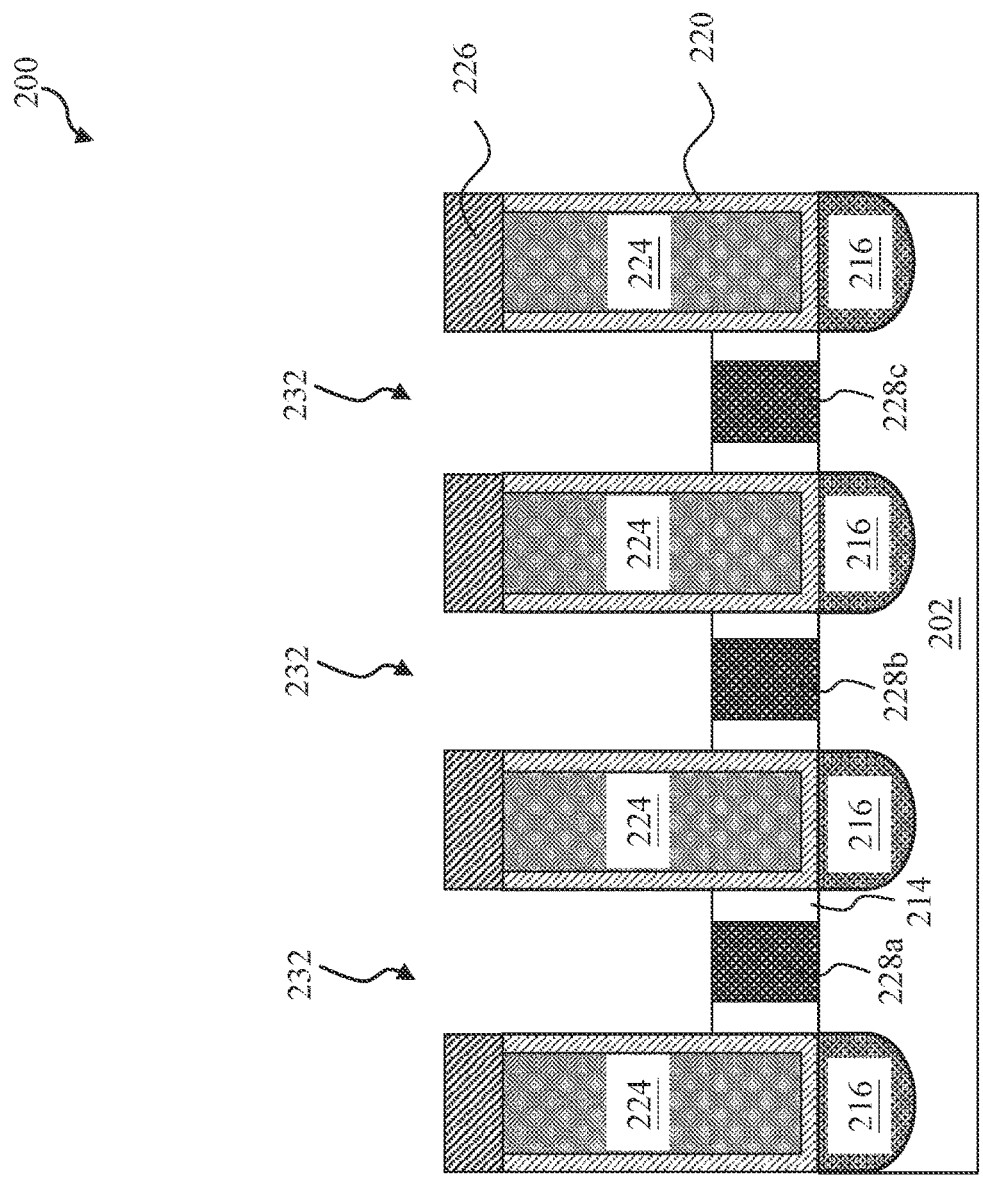
Figure 5:
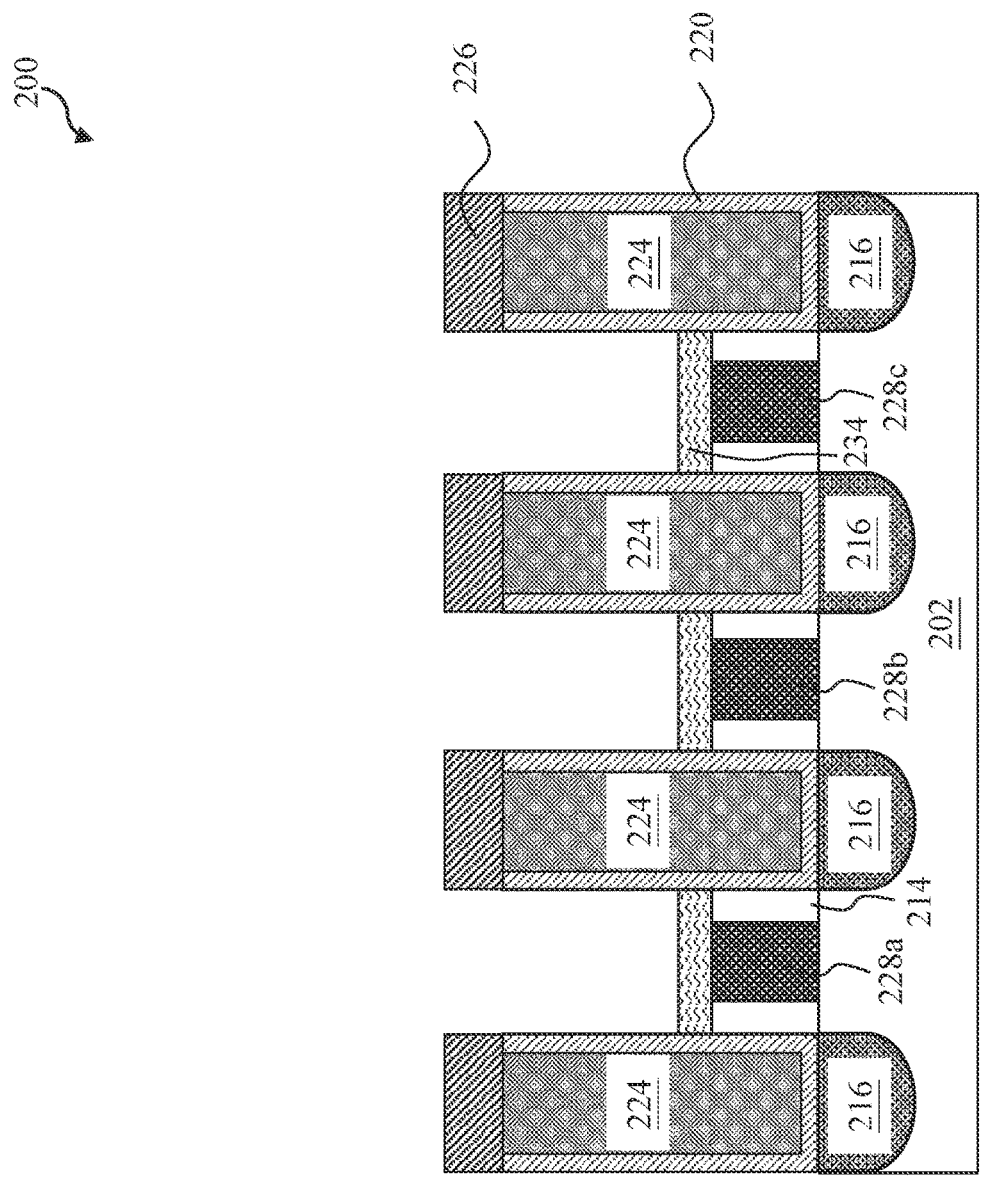

Referring to FIGS. 1 and 4-5, method 100 includes a block 18 where the functional gate structures and gate spacers are etched back to form recesses. In this depicted example, an etching process is performed to form recesses 232 on the workpiece 200. In some embodiments, the etching process is selective such that it etches the functional gate structure 228 and the gate spacers 214 without substantially etching the first CESL 220. The etching process may include a dry etching, a wet etching, a combination thereof, or other suitable etch process. In embodiments represented in FIG. 5, additional processing of the functional gate structure 228 such as forming a capping layer 234 at the top portion of the functional gate structure 228 is performed in the recesses 232. Because the capping layer 234 is disposed over top surfaces of the functional gate structure 228, the capping layer 234 may also be referred to as gate-top capping layer 234 or a gate-top etch stop layer 234. The capping layer 234 may be formed of aluminum, tungsten, cobalt, ruthenium, titanium, a suitable metal, or a combination thereof.

Figure 6:
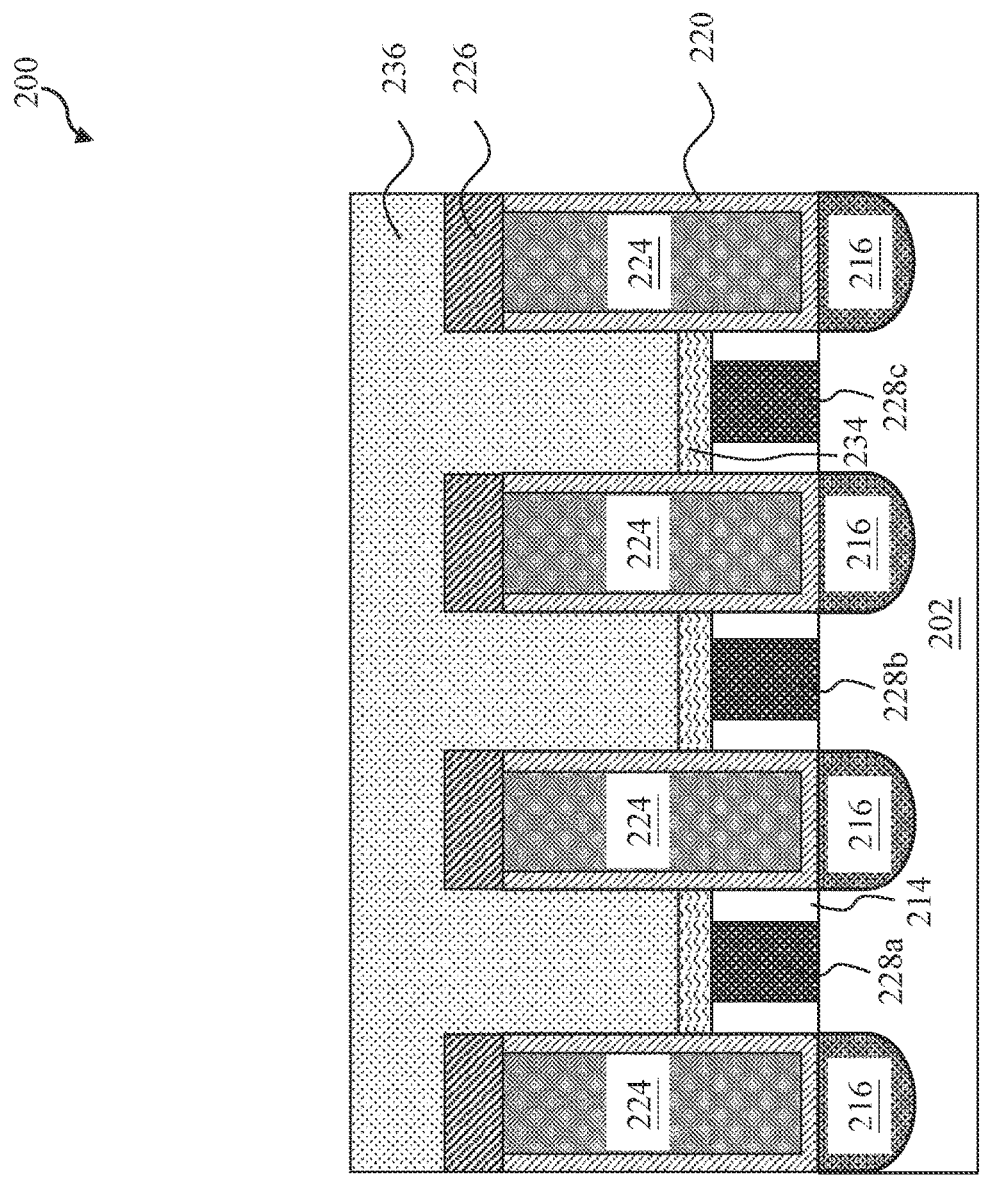
Figure 7:
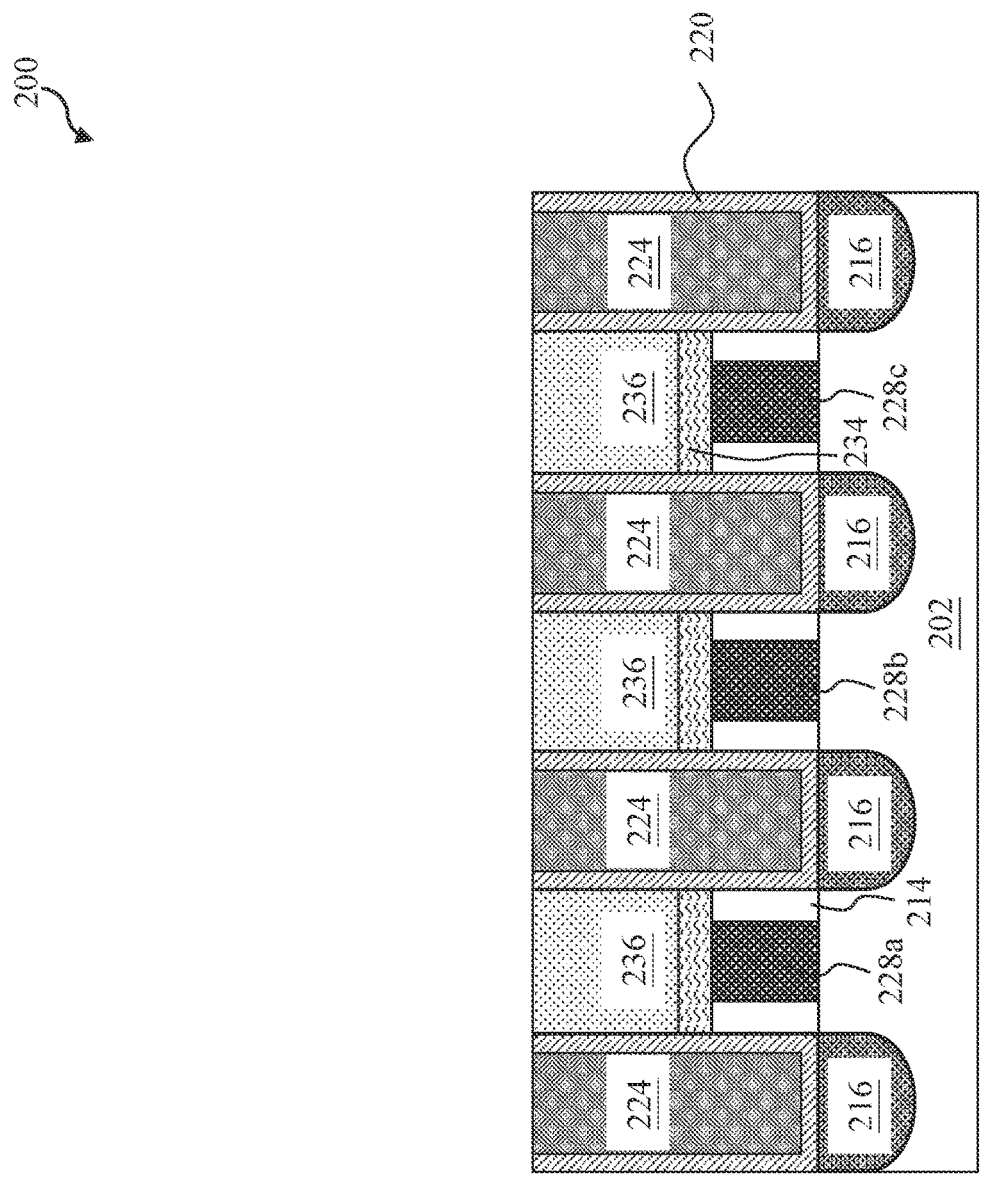

Referring to FIGS. 1 and 6-7, method 100 includes a block 20 where a self-aligned cap (SAC) layer 236 is formed in the recesses. The formation of the SAC layer 236 may include depositing a dielectric material 236 on the workpiece 200 to fill the recesses 232. The dielectric material may be deposited using high-density-plasma CVD (HDPCVD), PECVD, ALD, or a suitable deposition process. The dielectric material may be formed of silicon oxide, silicon nitride, silicon, silicon carbide or combinations thereof. A planarization process, such as a CMP process, may follow the deposition process to remove excessive dielectric material 236 and first hard mask layer 226 to expose the bottom ILD layer 224. A composition of the SAC layer 236 is different from a composition of the bottom ILD layer 224.

Figure 8:
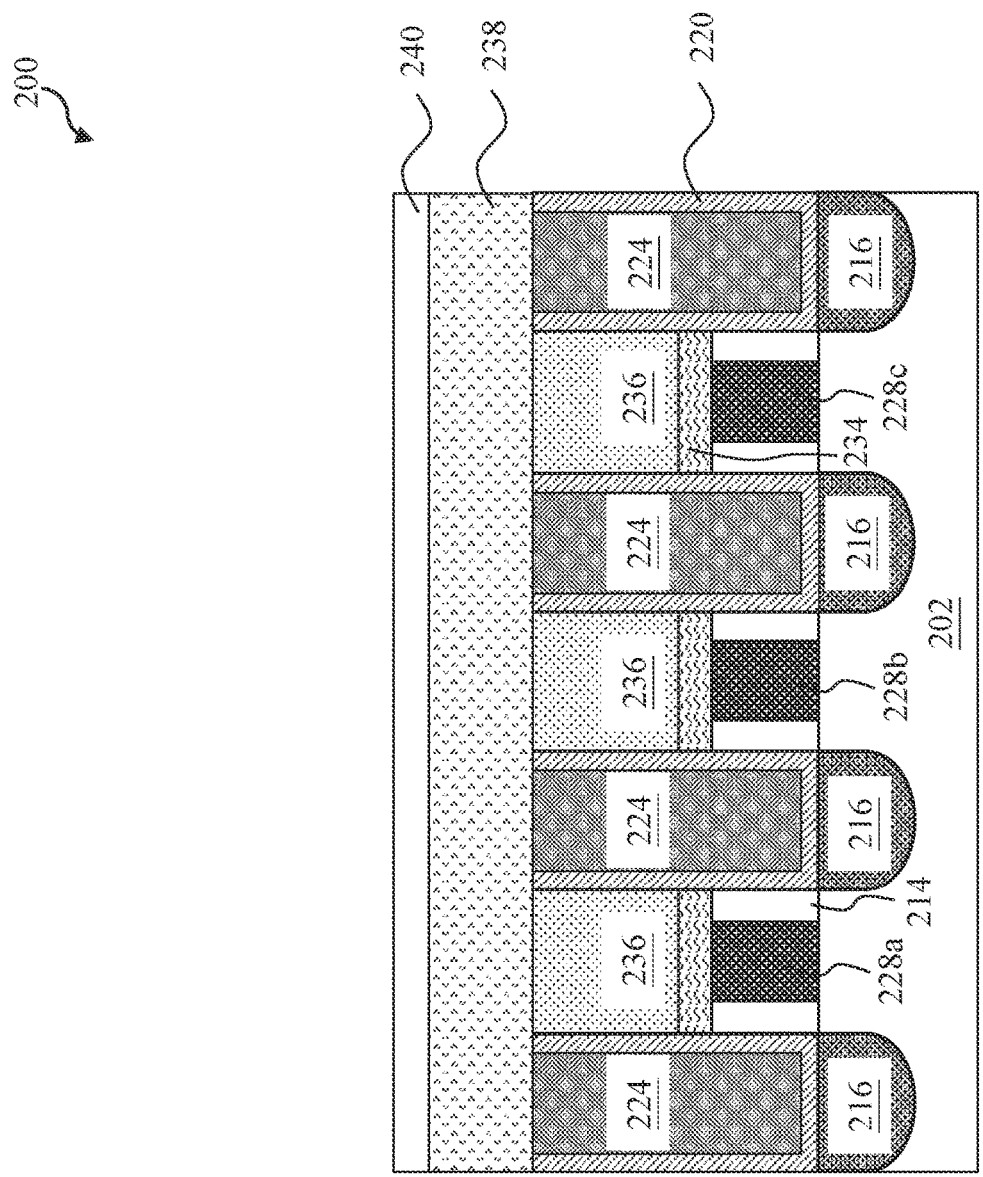
Figure 9:
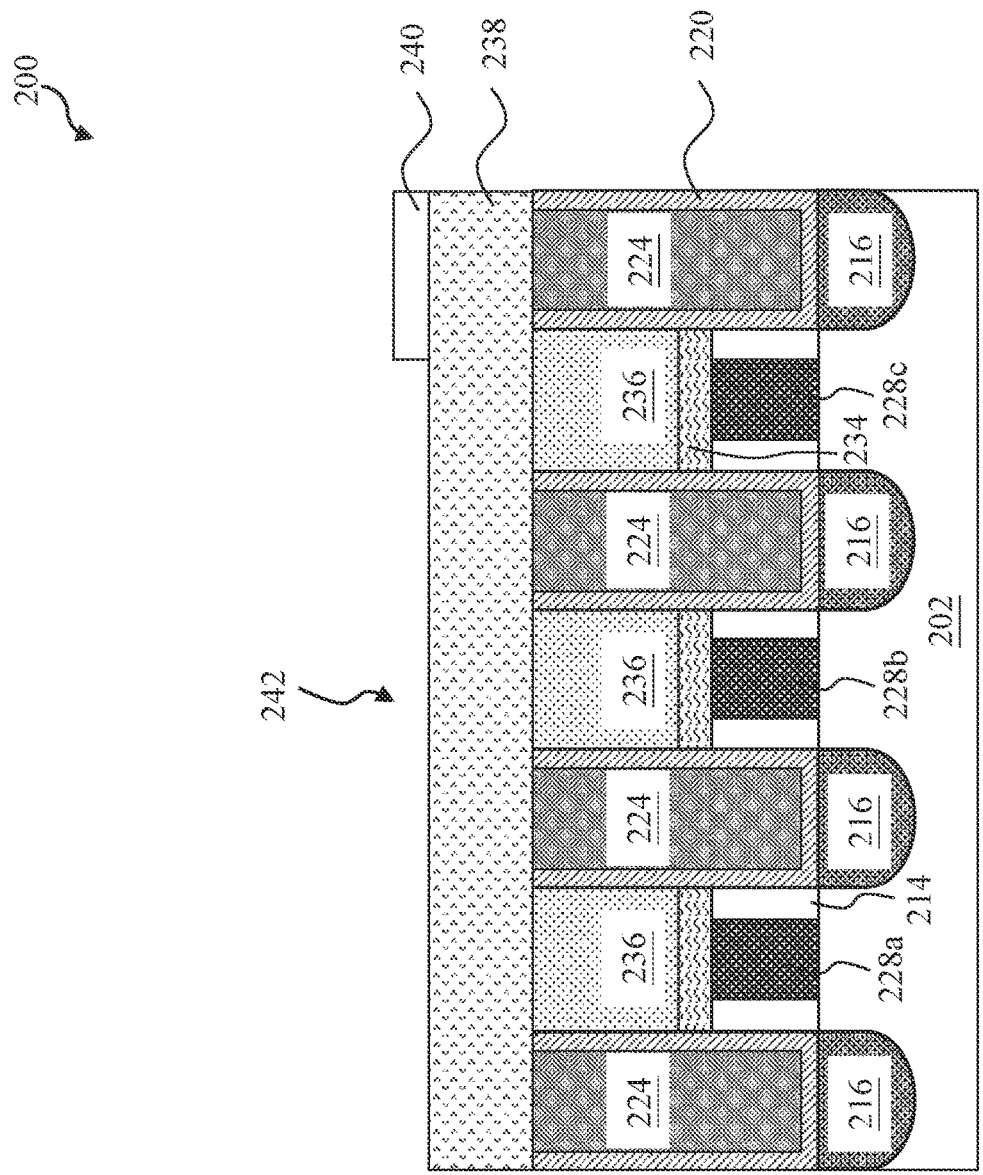

Referring to FIGS. 1 and 8-9, method 100 includes a block 22 where a first ILD layer and a second hard mask layer are deposited over the workpiece 200 and are patterned to selectively expose bottom ILD layers. As illustrated in FIG. 8, a first ILD layer 238 is deposited over the workpiece 200. In some embodiments, the first ILD layer 238 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, and/or other suitable dielectric materials. The first ILD layer 238 may be deposited by CVD, FCVD, PECVD, or other suitable process. The second hard mask layer 240 is deposited on the first ILD layer 238 by CVD, PECVD, ALD, or other suitable process. The material of the second hard mask layer 240 contains metal elements and may include titanium oxide, titanium nitride, tungsten compounds (e.g., tungsten carbide), for example. With reference to FIG. 9, the second hard mask layer 240 is patterned, by a lithography process, to leave a portion of the second hard mask layer 240 over the workpiece 200 and form an opening 242. An exemplary lithography process includes spin-on coating a photoresist layer (not shown), soft baking of the photoresist layer, mask aligning, exposing, post-exposure baking, developing the photoresist layer, rinsing, and drying (e.g., hard baking). After the photoresist layer is patterned, the second hard mask layer 240 is etched using the patterned photoresist layer as an etch mask to form the patterned second hard mask layer 240.

Figure 10:
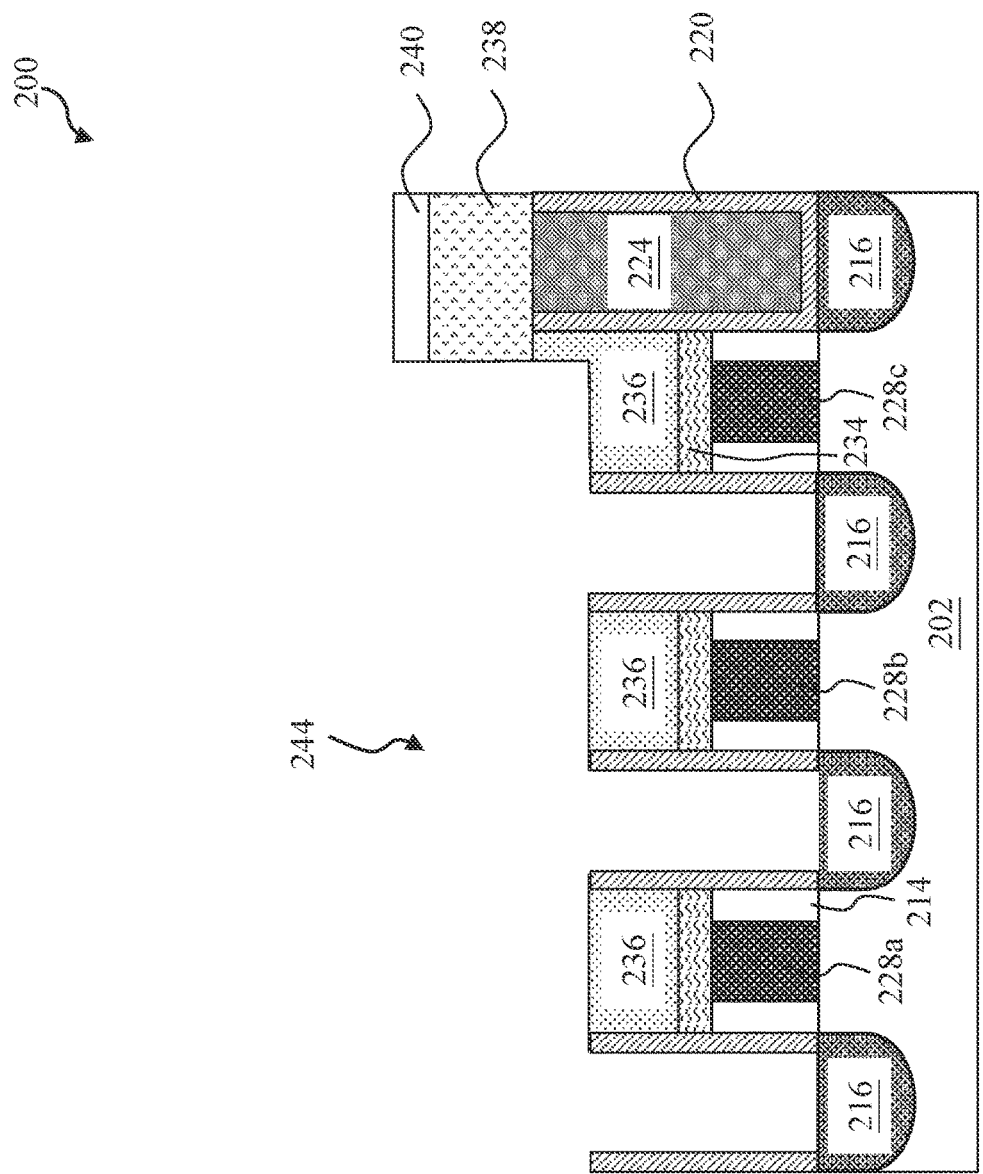

Referring to FIGS. 1 and 10, method 100 includes a block 24 where the exposed bottom ILD layers are recessed to form source/drain contact openings. While using the patterned second hard mask layer 240 as an etch mask, one or more etching processes may be performed to the workpiece 200 to selectively recess the first ILD layer 238 and the bottom ILD layer 224 exposed in the opening 242 to form source/drain contact openings 244 exposing the source/drain features 216. In this depicted example, three source/drain features 216 are exposed by the source/drain contact openings 244. The etching processes may include a first etching process employing an etchant that etches the first ILD layer 238 and the bottom ILD layer 224 while substantially does not etch the composition of the first CESL 220 and the SAC layer 236, and a second etching process that removes bottom portions of the first CESL 220 directly formed on the source/drain features 216. In some implementations, one or more rinse or cleaning processes may be performed to clean the exposed source/drain features 216. The patterned second hard mask layer 240 may be removed after forming the source/drain contact opening 244.

Figure 11:
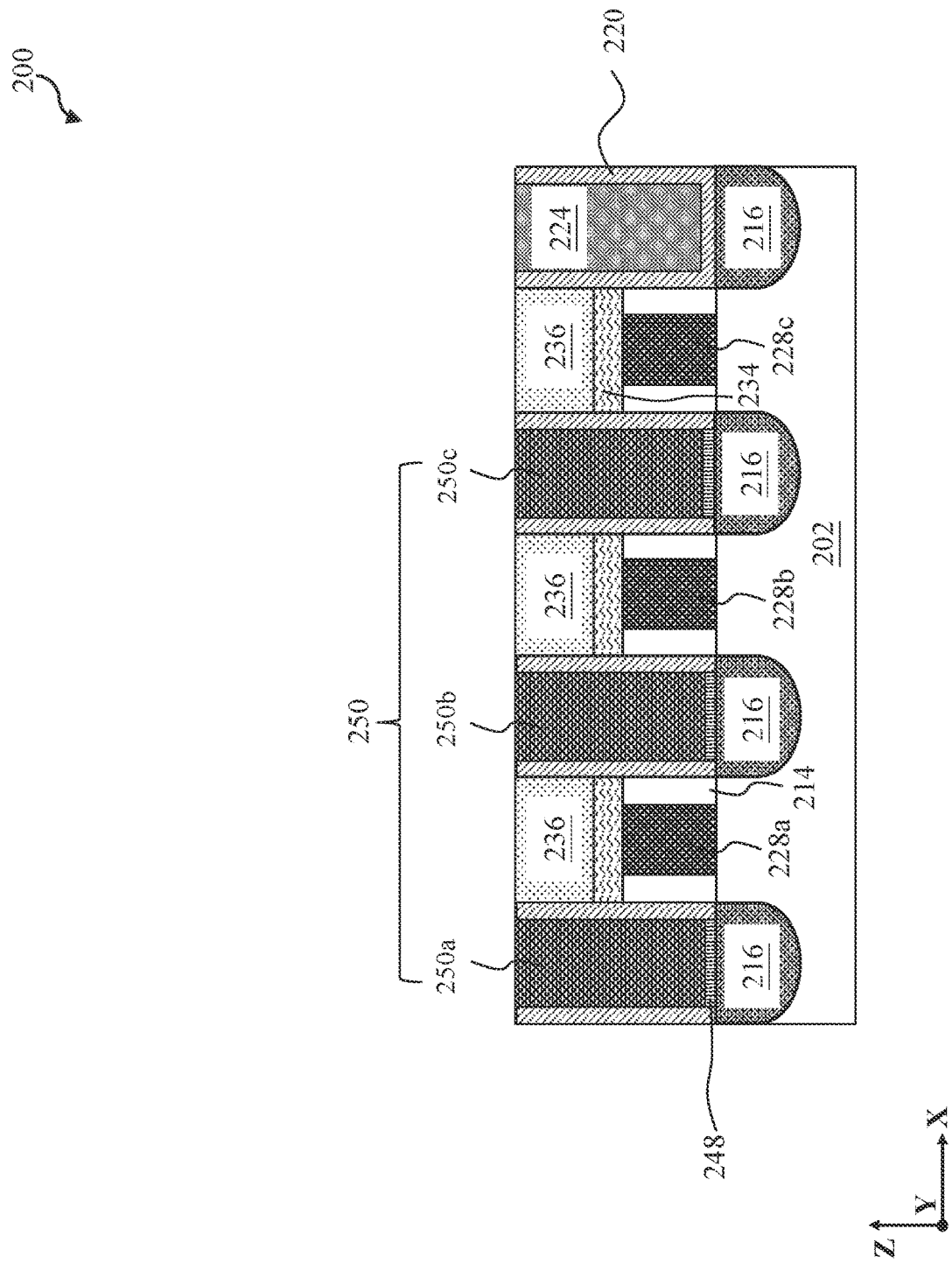

Referring to FIGS. 1 and 11, method 100 includes a block 26 where a silicide layer 248 and a source/drain contact 250a/250b/250c are formed in each of the source/drain contact openings 244. In some instances, the silicide layer 248 may include titanium silicide, cobalt silicide, nickel silicide, tantalum silicide, or tungsten silicide. The source/drain contact 250a/250b/250c is then formed over the silicide layer 248. The source/drain contacts 250a, 250b, and 250c may be collectively referred as source/drain contact 250. The source/drain contact 250 may be formed in multiple steps. For example, a barrier layer (not explicitly shown) may be deposited over the top surface of the workpiece 200. The barrier layer may include a metal or a metal nitride, such as a titanium nitride, cobalt nitride, nickel, tungsten nitride. Thereafter, a metal fill layer (not explicitly shown) may be deposited over the barrier layer. The metal fill layer may include tungsten, ruthenium, cobalt, nickel, or copper. A CMP process may be followed to remove excessive materials, define the final shape of the source/drain contact 250, and provide a planar surface.

Figure 12:
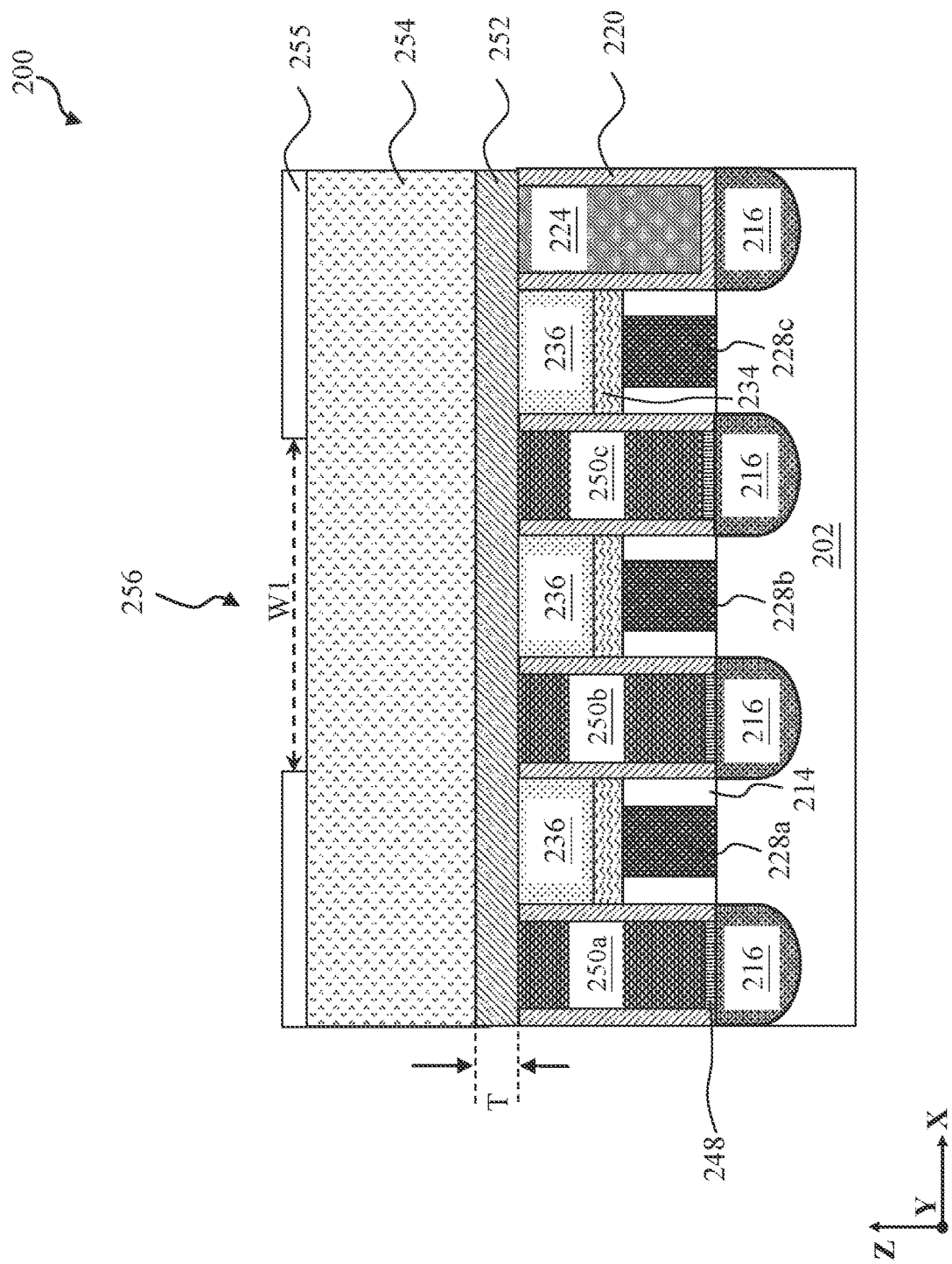
Figure 13:
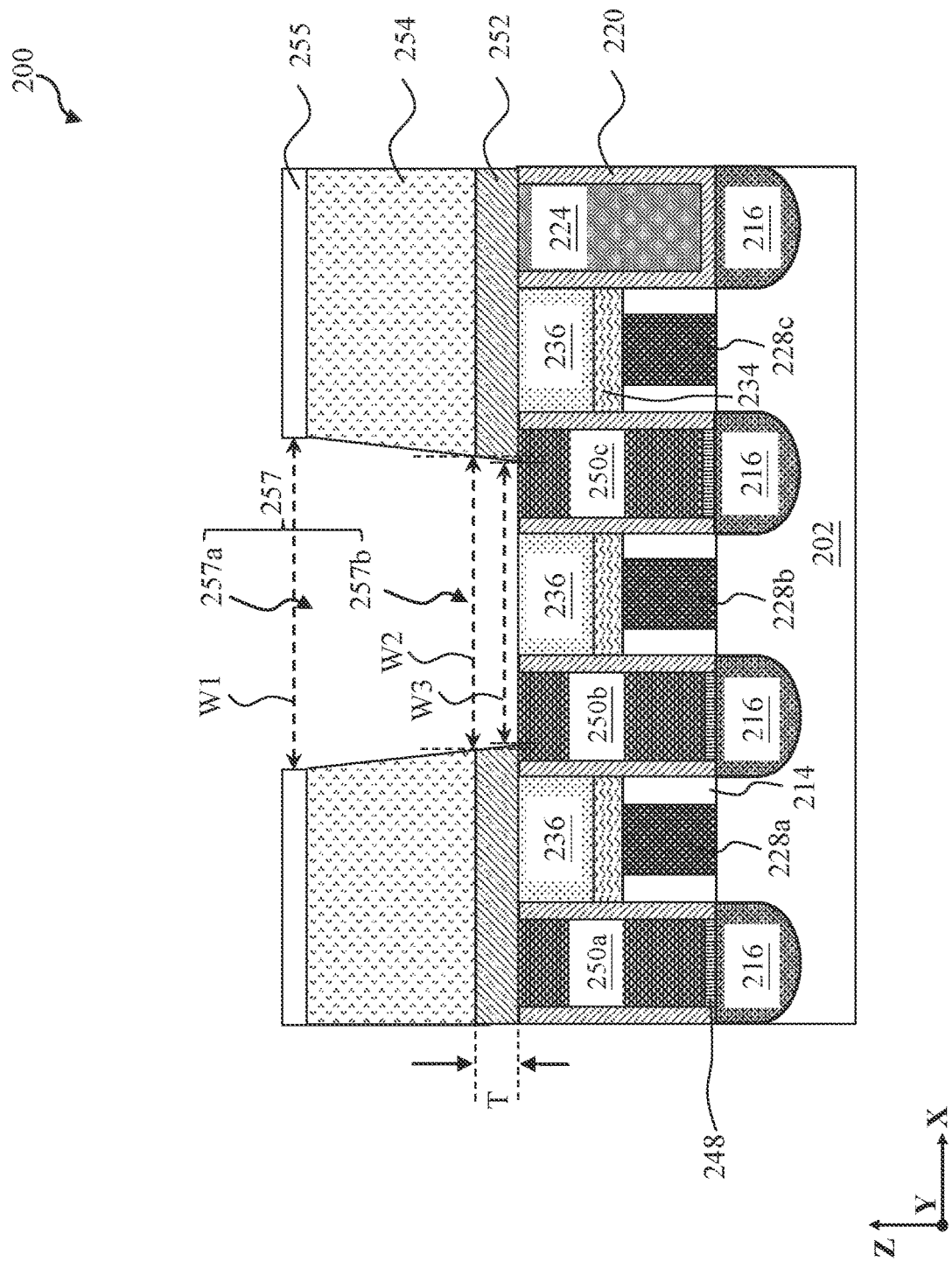

Referring to FIGS. 1 and 12-13, method 100 includes a block 28 where a second contact etch stop layer (CESL) and a second ILD layer formed over the workpiece. The second CESL 252 may be formed of silicon nitride, silicon oxide, silicon, silicon carbide, silicon carbonitride, and/or other materials known in the art. A composition of the second CESL 252 is different from a composition of the SAC layer 236. More specifically, with respect to an etch process, the second CESL 252 may have an etch rate that is different from that of the SAC layer 236. This difference in etch rate allows detection of an etch end point. The second CESL 252 may be deposited using PECVD, ALD, PEALD, and/or other suitable deposition processes and has a thickness T along the Z direction. Considering the formation of the to-be-formed gate contact via opening 268 (shown in FIG. 17), the thickness T may be between about 5 nm and about 15 nm. The composition and formation of the second ILD layer 254 may be similar to those of the first ILD layer 238. A thickness of the second ILD layer 254 may be may be between about 40 nm and about 80 nm.

Still referring to FIGS. 1 and 12-13, method 100 includes a block 30 where the second ILD layer 254 and the second CESL 252 are patterned to form a metal feature opening which exposes two source/drain contacts 250b and 250c. A masking element 255 is formed on the workpiece 200. In some embodiments, the masking element 255 may include a hard mask layer and/or a photoresist layer. The masking element 255 is patterned to have an opening 256 with a width W1 along the X direction. An etching process is then performed to remove the second ILD layer 254 and the second CESL 252 exposed in the opening 256. As described above, since the second CESL 252 has an etch rate that is different from that of the SAC layer 236, the etching may be accurately controlled to stop at the top surface of the SAC layer 236. The etching process may include an anisotropic etching process such as an anisotropic dry etching process. After performing the anisotropic etching process, a tapered opening 257 is formed. That is, when view along the Y direction, the opening 257 includes two inverted tapered sidewalls that taper along the depth of the opening 257. The tapered opening 257 includes a first tapered portion 257a formed in the second ILD layer 254 and a second tapered portion 257b (interchangeably referred to as metal feature opening 257b) formed in the second CESL 252. By providing the second ILD layer 254 and employing the anisotropic etching process, a width (either a width W2 of a top surface or a width W3 of a bottom surface) of the metal feature opening 257b is less than the width W1 of the opening 256. Thus, the metal feature 262 to be formed in the metal feature opening 257b would have a reduced dimension without employing a high-resolution lithography (e.g., Extreme Ultraviolet (EUV) Lithography). In some embodiments, the width W2 of a top surface of the metal feature opening 257b is between about 20 nm and about 80 nm. When viewed from the Y direction, the metal feature opening 257b exposes at least a portion of the source/drain contact 250b, at least a portion of the source/drain contact 250c, and the SAC layer 236 formed over the gate structure 228b. In other implementations (e.g., other device areas in the workpiece 200 or other workpieces), the metal feature opening 257b may be formed to expose other device features. Other exemplary alternative embodiments of the metal feature opening 257b will be discussed in further detail with reference to FIGS. 20-24.

Figure 14:
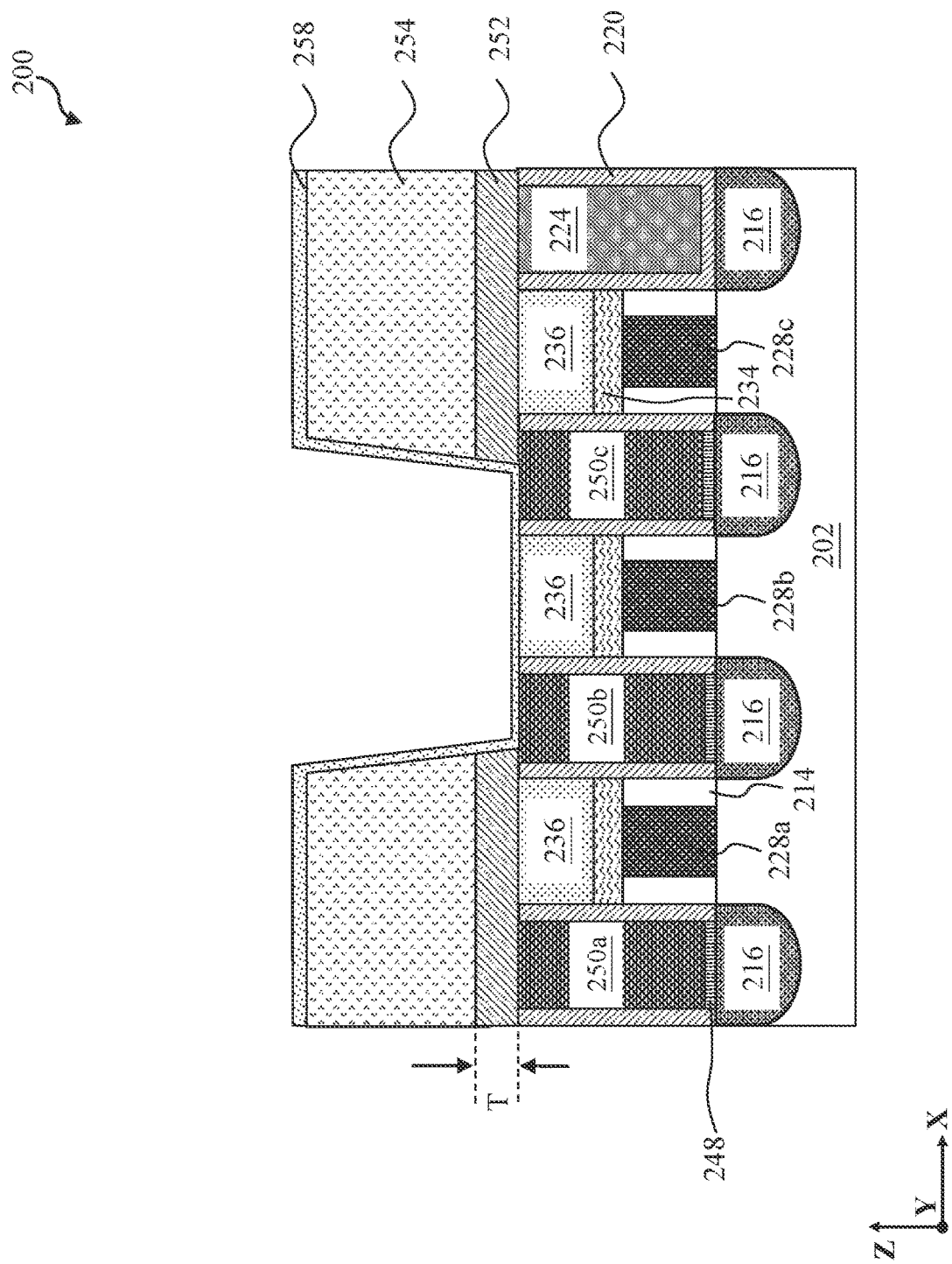
Figure 15:
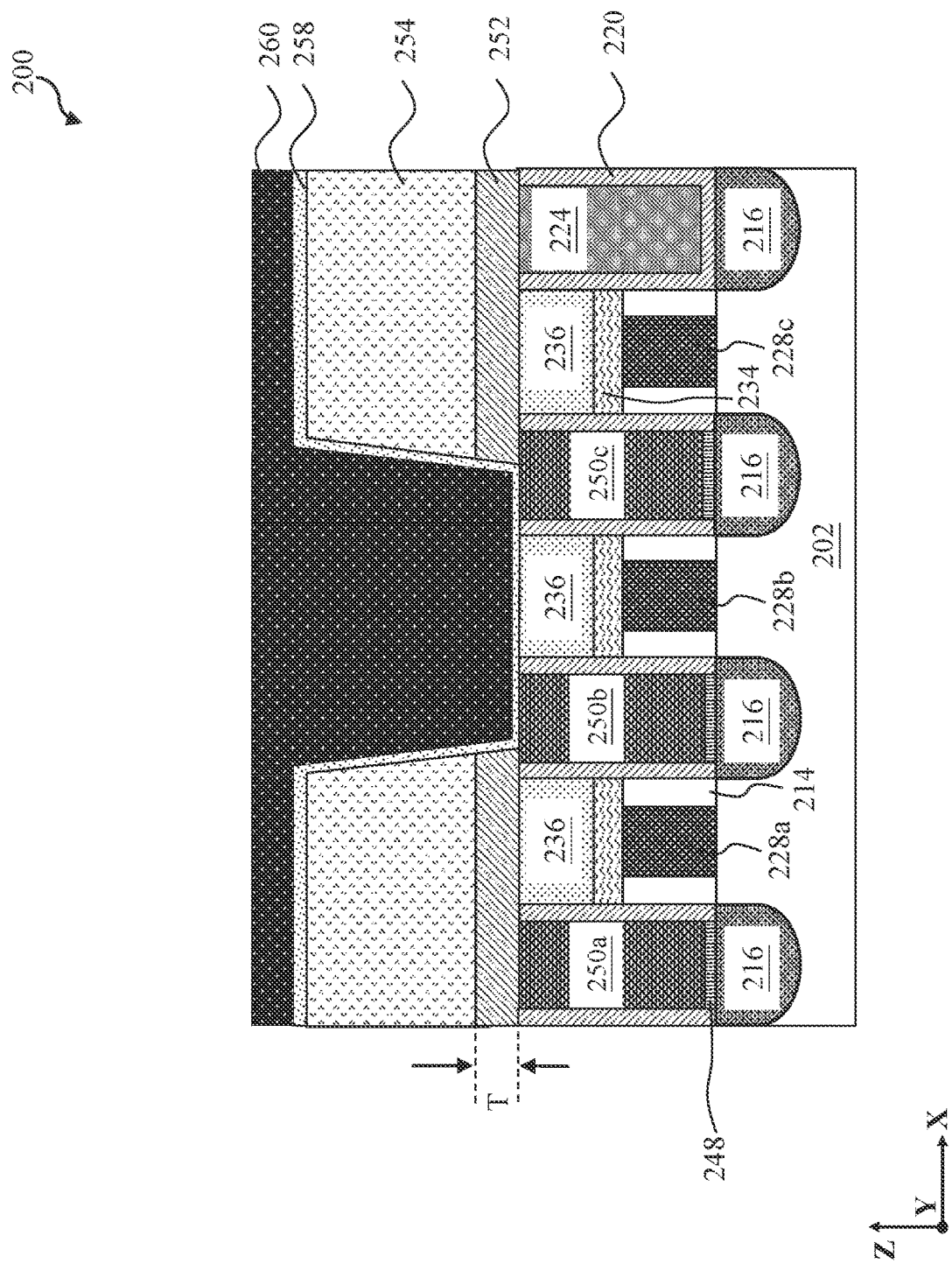
Figure 16:
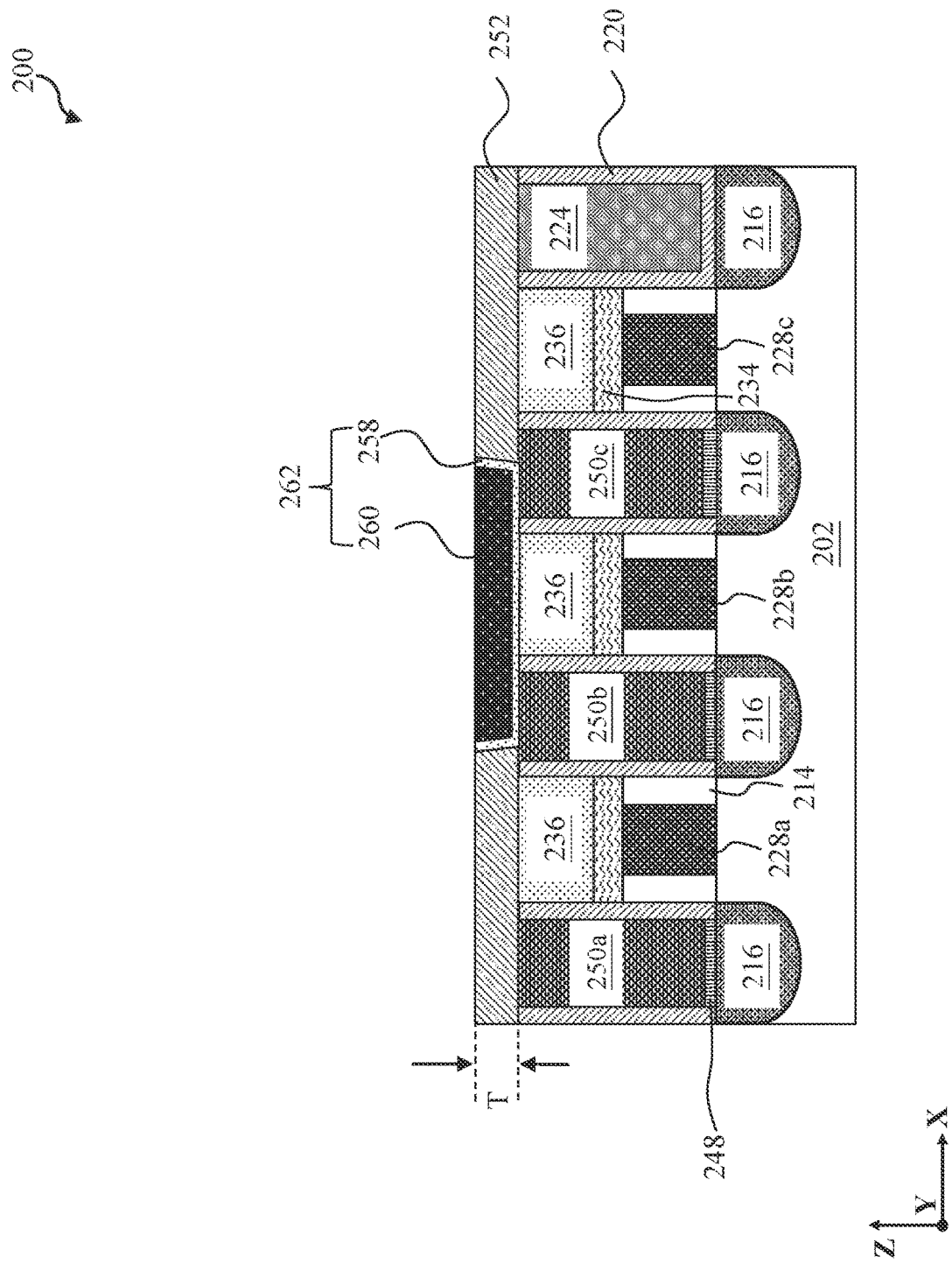

Referring to FIGS. 1 and 14-16, method 100 includes a block 32 where a metal feature is formed in the metal feature opening. As depicted in FIG. 14, a barrier layer 258 is conformally deposited to have a generally uniform thickness over the top surface of the workpiece 200 (e.g., having substantially the same thickness on the top and sidewall surfaces of the patterned second CESL 252 and the patterned second ILD layer 254). The barrier layer 258 may be formed of tungsten, ruthenium, titanium nitride, or tantalum nitride. With reference to FIG. 15, a metal fill layer 260 is deposited over the barrier layer 258 using a suitable deposition technique, such as an ALD process, a PVD process or a CVD process. The metal fill layer 260 may be formed of tungsten, ruthenium, cobalt, copper, molybdenum, or an alloy thereof. In an embodiment, the metal fill layer 260 and a metal fill layer of the source/drain contact 250 are formed of a same material. In some embodiments, considering the metal gapfill capability and process integration, the metal fill layer 260 and a metal fill layer of the source/drain contact 250 may have different compositions. After the deposition of the metal fill layer 260, a CMP process may be performed to remove materials over the second CESL 252 and the CMP process may be accurately controlled to stop at the top surface of the second CESL 252 to define a final shape of the metal feature 262, as shown in FIG. 16. In this depicted example, the combination of the barrier layer 258 and metal fill layer 260 are referred as to the metal feature 262. At the conclusion of the CMP process, a top surface of the metal feature 262 is coplanar with a top surface of the second CESL 252. Thus, a thickness (along the Z direction) of the metal feature 262 is substantially equal to the thickness T of the second CESL 252. That is, a thickness of the metal feature 262 may be between 5 nm and about 15 nm. As the metal feature 262 is formed in the tapered metal feature opening 257b, it tracks the shape of the tapered metal feature opening 257b and includes tapered sidewalls. In embodiments illustrated in FIG. 16, the metal feature 262 is formed over and directly contacts the two adjacent source/drain contacts 250b and 250c spaced apart by one gate structure 228b. That is, the metal feature 262 is further formed over the gate structure 228b and directly contacts the SAC layer 236 over the gate structure 228b, and the gate structure 228b is spaced apart from the metal feature 262 by the SAC layer 236. In other implementations, the metal feature 262 may be configured to couple two or more source/drain contacts that are spaced apart by two or more gate structures and corresponding associated source/drain contacts. For example, the metal feature 262 may be configured to couple the source/drain contacts 250a and 250c spaced apart by gate structures 228a-228b and source/drain contact 250b. In some embodiments, the metal feature 262 may be configured to couple source/drain contacts 250a, 250b, and 250c that are spaced apart from one another by gate structures 228a-228b.

Figure 17:
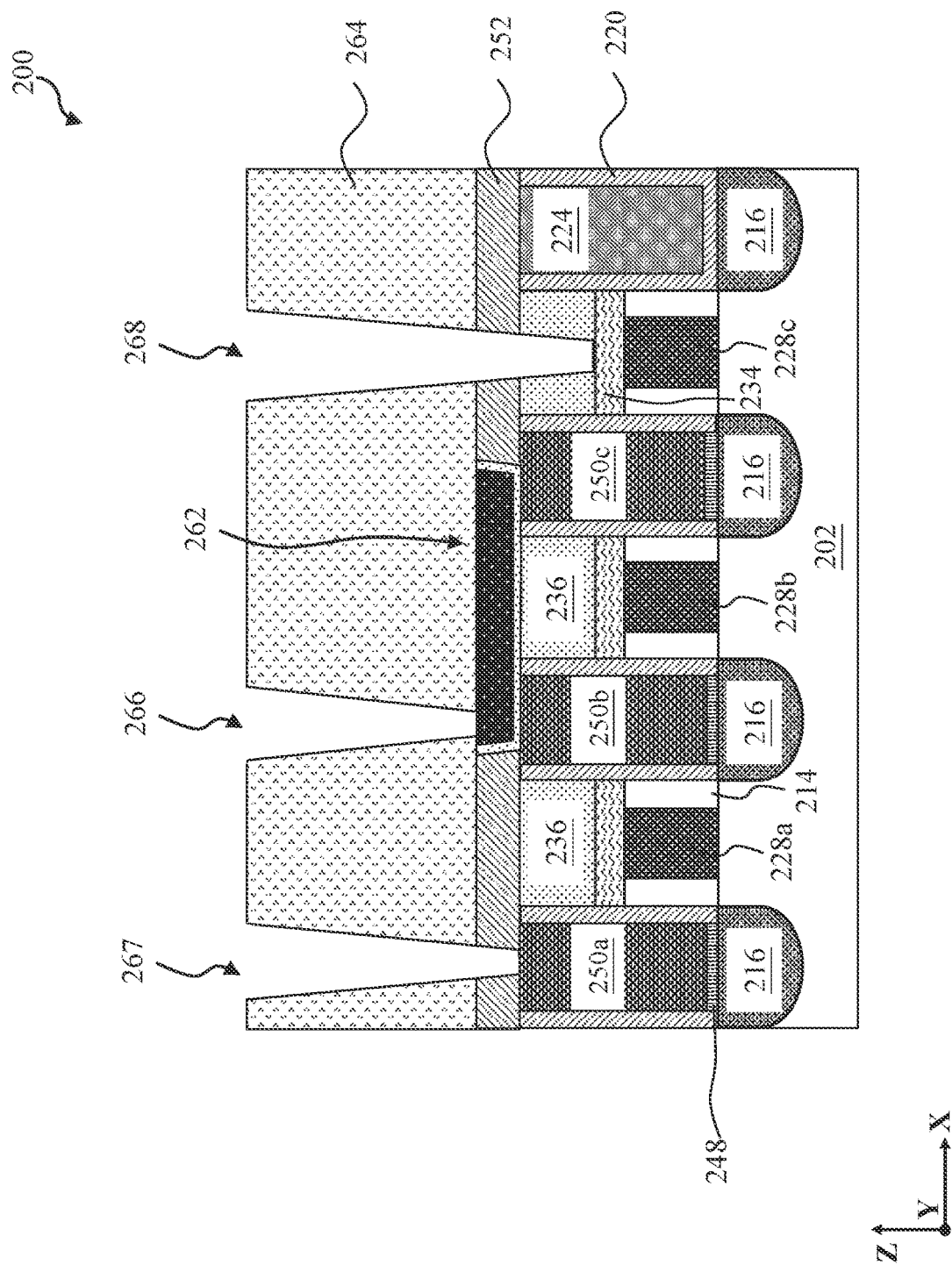
Figure 18:
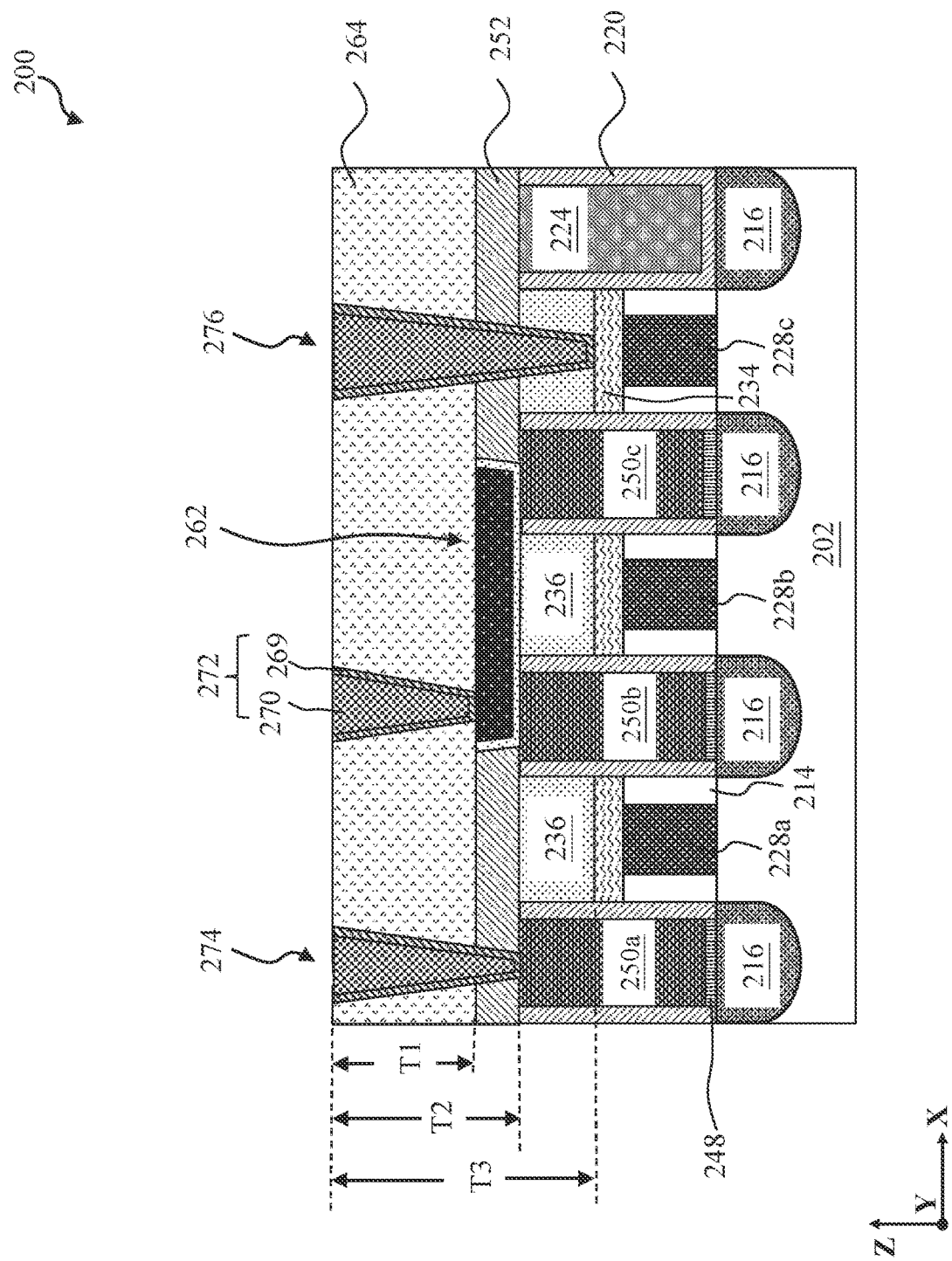

Referring to FIGS. 1 and 17-18, method 100 includes a block 34 where a contact via is formed to electrically connect to the metal feature 262. A third ILD layer 264 is formed over the second CESL 252 and the metal feature 262. The material and formation of the third ILD layer 264 may be in a way similar to those of the second ILD layer 254. As illustrated in FIG. 17, openings 266a, 266b, and 266c are formed to expose surfaces of the source/drain contact 250a, metal feature 262, and the capping layer 234, respectively. The opening 266 may be formed by penetrating the third ILD layer 264 to expose a portion of the top surface of the metal feature 262. The opening 267 may be formed by penetrating the third ILD layer 264 and the second CESL 252 to expose a portion of the top surface of the source/drain contact 250a. The opening 268 may be formed by penetrating the third ILD layer 264, the second CESL 252, and the SAC layer 236 to expose a portion of the top surface of the capping layer 234 disposed over the gate structure 228c. The openings 266, 267, and 268 may be formed simultaneously or in multiple steps. Referring to FIG. 18, contact vias 272, 274, and 276 (may be referred to as contact vias 272-276) are formed, simultaneously or in multiple steps, to fill the openings 266, 267, and 268. In embodiments represented in FIG. 18, each contact via includes a barrier layer 269 and a metal fill layer 270. The material and formation of the barrier layer 269 and a metal fill layer 270 in the contact vias 272, 274, and 276 may be in a way similar to that of the barrier layer 258 and a metal fill layer 260 in the metal feature 262 described with reference to FIGS. 14-16, respectively. A CMP process is followed to remove excessive materials and define the final shapes of the contact vias 272, 274, and 276. As shown in FIG. 18, contact via 272 directly contacts the metal feature 262 and has a thickness T1 along Z direction. Thus, the contact via 272 is electrically connected to the source/drain contacts 250b and 250c by way of the metal feature 262. Contact via 274 directly contacts the source/drain contact 250a and has a thickness T2 greater than T1. Gate contact via 276 directly contacts the capping layer 234 over the gate structure 228c and has a thickness T3 greater than T2. In some implementations, T1 is between about 3 nm and about 20 nm, T2 is between about 10 nm and about 35 nm, and T3 is between about 15 nm and about 60 nm.

Figure 19:
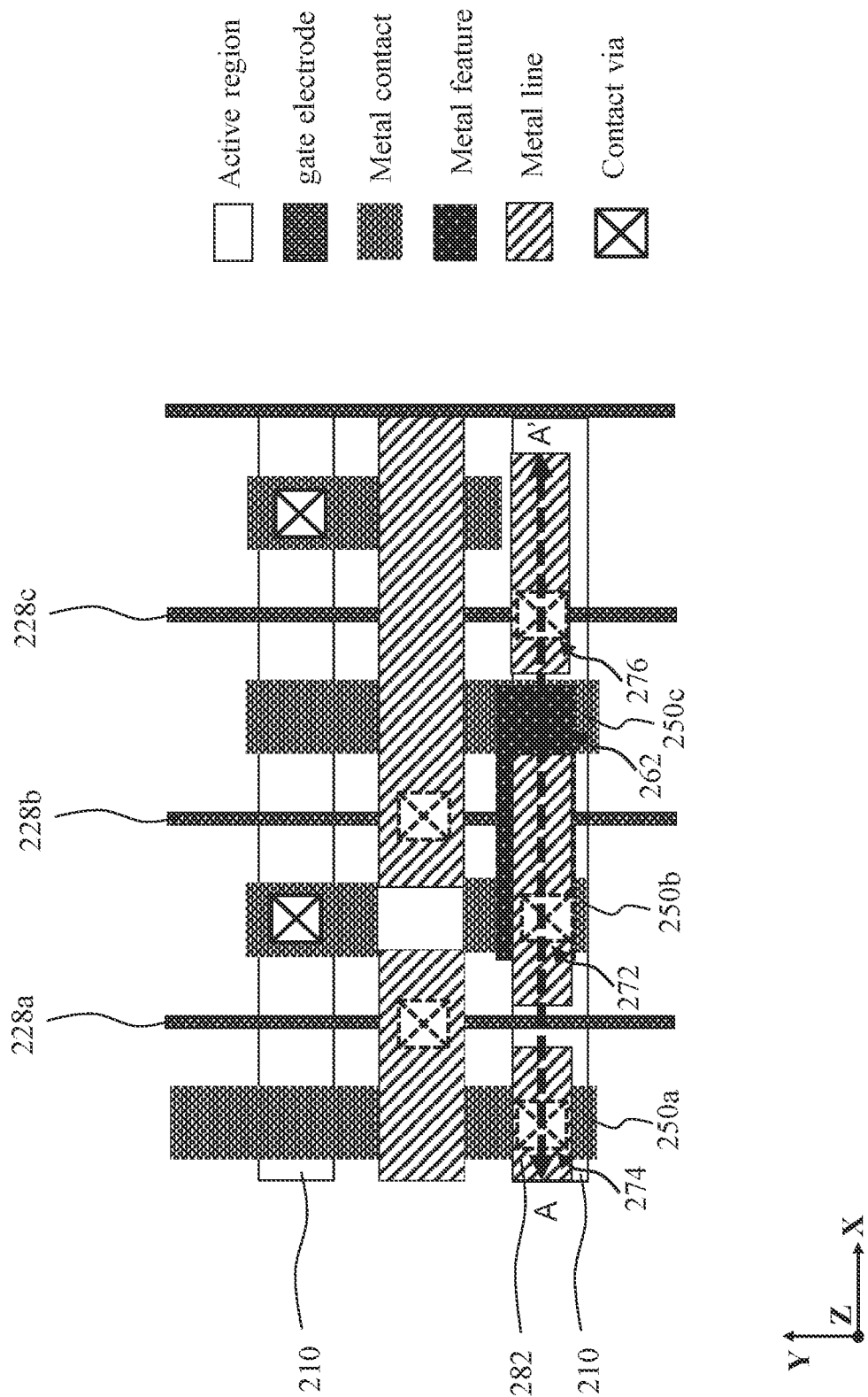
FIG. 19 illustrates a fragmentary layout view of the first device area of a semiconductor device, according to various aspects of the present disclosure.
Figure 20:
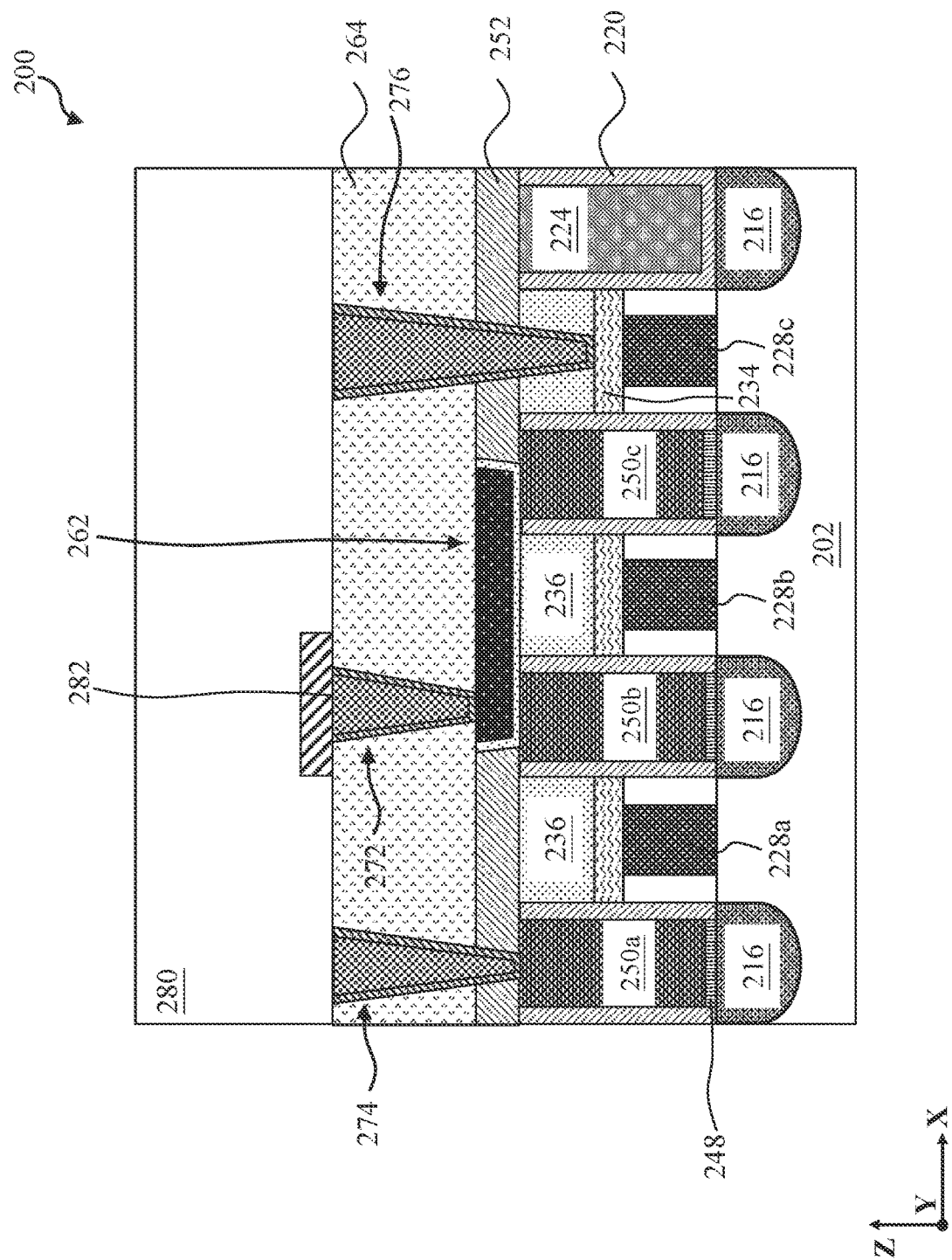
FIG. 20 illustrates a fragmentary cross-sectional view of the first device area taken along line A-A' in FIG. 2 and FIG. 19, according to various aspects of the present disclosure.

Referring to FIGS. 1 and 19-20, method 100 includes a block 36 where further processes are performed. Such further processes may include forming further features in the structure 280 for interconnecting devices (e.g., the semiconductor device 200) fabricated across the semiconductor substrate 202. For example, such further processes may include deposition of an intermetal dielectric (IMD) layer, formation of metal lines (e.g., forming a metal line 282 on the third ILD layer 264), formation of power rails, and/or other suitable semiconductor device features. FIG. 19 illustrates a fragmentary layout view of the first device area of the semiconductor device 200 after forming the metal line 282 on the third ILD layer 264. In embodiments represented in FIG. 19, the workpiece 200 includes a first type of source/drain contact vias (e.g., contact via 274) directly coupled to source/drain contacts (e.g., source/drain contact 250a) and a second type of source/drain contact vias (e.g., contact via 272) coupled to source/drain contacts (e.g., source/drain contacts 250b and 250c) through metal features 262. To reduce the number of metal lines in structures 280 while keeping the design flexibility, in the workpiece 200, a ratio between the number of the second type of source/drain contact vias and the number of the first type of source/drain contact vias may be less than 1:3. However, it is understood by one of ordinary skill in the art that this ratio may be adaptively adjusted based on the circuit architecture and function, for example. FIG. 20 illustrates a fragmentary cross-sectional view of a portion of the semiconductor device 200 along line A-A' in FIG. 2 and/or FIG. 19, where line A-A' cuts through gate structure 228 and the metal feature 262. The metal feature 262 is spaced apart from the metal line 282 by the third ILD layer 264.

The structures and associated methods of the present disclosure provide several benefits. For example, the second CESL 252 with the metal feature 262 embedded therein, provides a mezzanine interconnect layer between the MEOL features (e.g., source/drain contacts 250b-250c) and the BEOL features (e.g., contact vias in the third ILD layer 264). Thus, by forming the metal feature 262 between the contact vias 272-276 and the source/drain contacts 250b-250c, the usage of metal lines over the third ILD layer 264 may be reduced. For example, assuming a first chip and a second chip have a same number of transistors and are designed to fulfill same functions, the first chip employs a first interconnect structure having the additional mezzanine interconnect layer, and the second chip employs a second interconnect structure which does not include the additional mezzanine interconnect layer, then the first chip would have less number of metal lines over the third ILD layer 264 than that of the second chip since some device features are connected by the metal feature 262 embedded in the second CESL 252. That is, the number N1 of metal lines in the first chip is less than the number N2 of metal lines in the second chip. If N1 is increased to N2, without reducing the metal line pitch, the transistor density of the first chip may be increased and greater than that of the second chip. Accordingly, by providing an alternative method of interconnection, the transistor density may be advantageously increased without inducing the aforementioned reliability issues (e.g., patterning issues and/or gap filling issues) and constraining the flexibility of design.

In addition, as the dimensions of the IC devices decrease, it become more and more challenging to perfectly align the contact vias and the source/drain contacts. When the contact vias and the source/drain contacts are misaligned, the contact resistance may increase and cause performance issues. By providing the metal feature 262 that extends along several device features (e.g., metal feature 262 extends along source/drain contacts 250b-250c and SAC layer 236), the issue associated with satisfactorily aligning contact vias with the source/drain contacts may be resolved. In embodiments represented in FIGS. 18-20, the metal feature 262 extends along the X direction and is in direct contact with source/drain contacts 250b and 250c, and the contact via 272 is electrically shared by source/drain contacts 250b and 250c. That is, for the two source/drain contacts 250b and 250c, only one contact via 272 is needed. Therefore, the number of contact vias may be also advantageously reduced. Accordingly, the fabrication processes may be advantageously simplified, and associated cost may be advantageously reduced.

Figure 21:
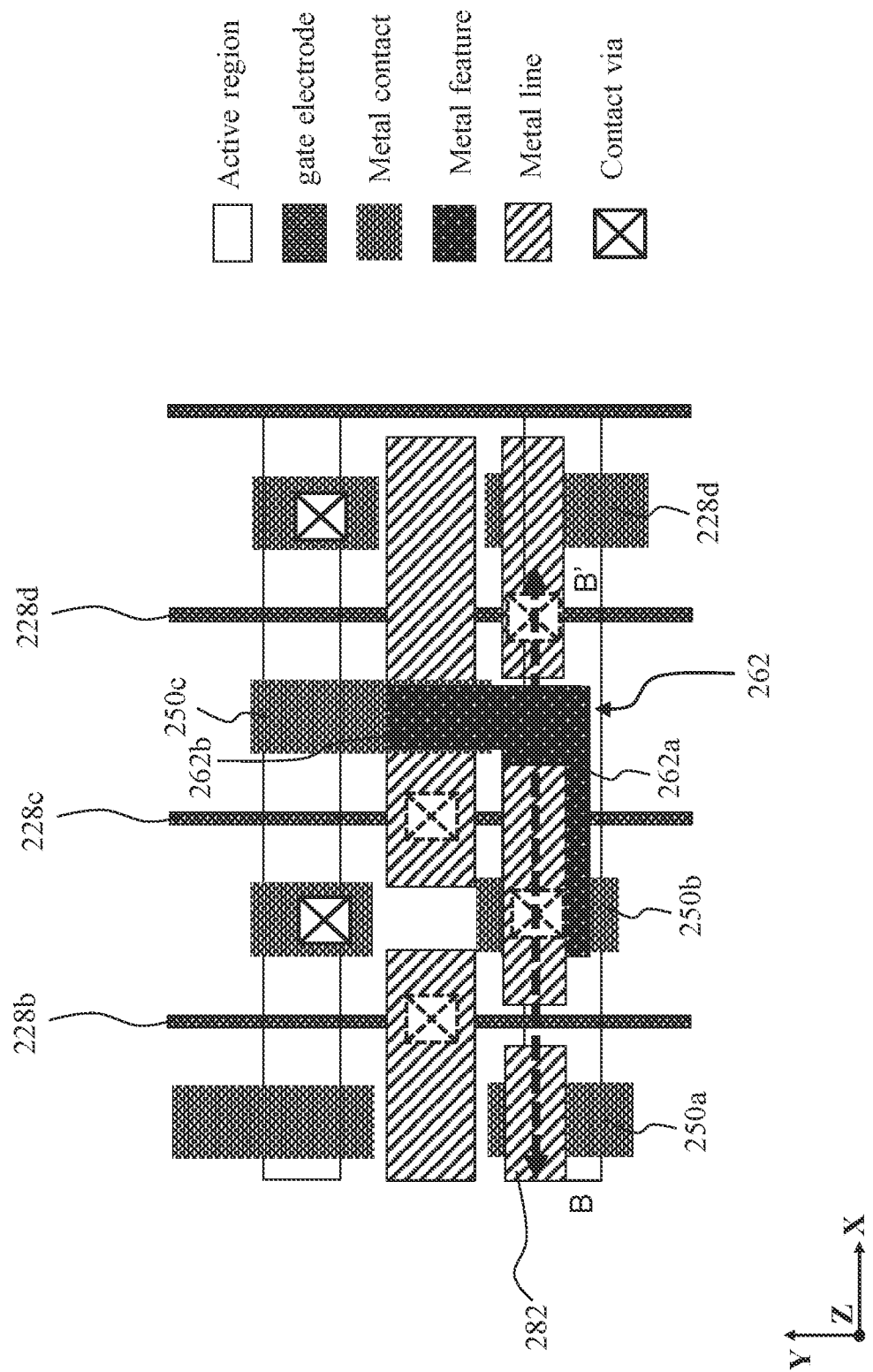
FIG. 21 illustrates a fragmentary layout view of a second device area of the semiconductor device, according to various aspects of the present disclosure.
Figure 22:
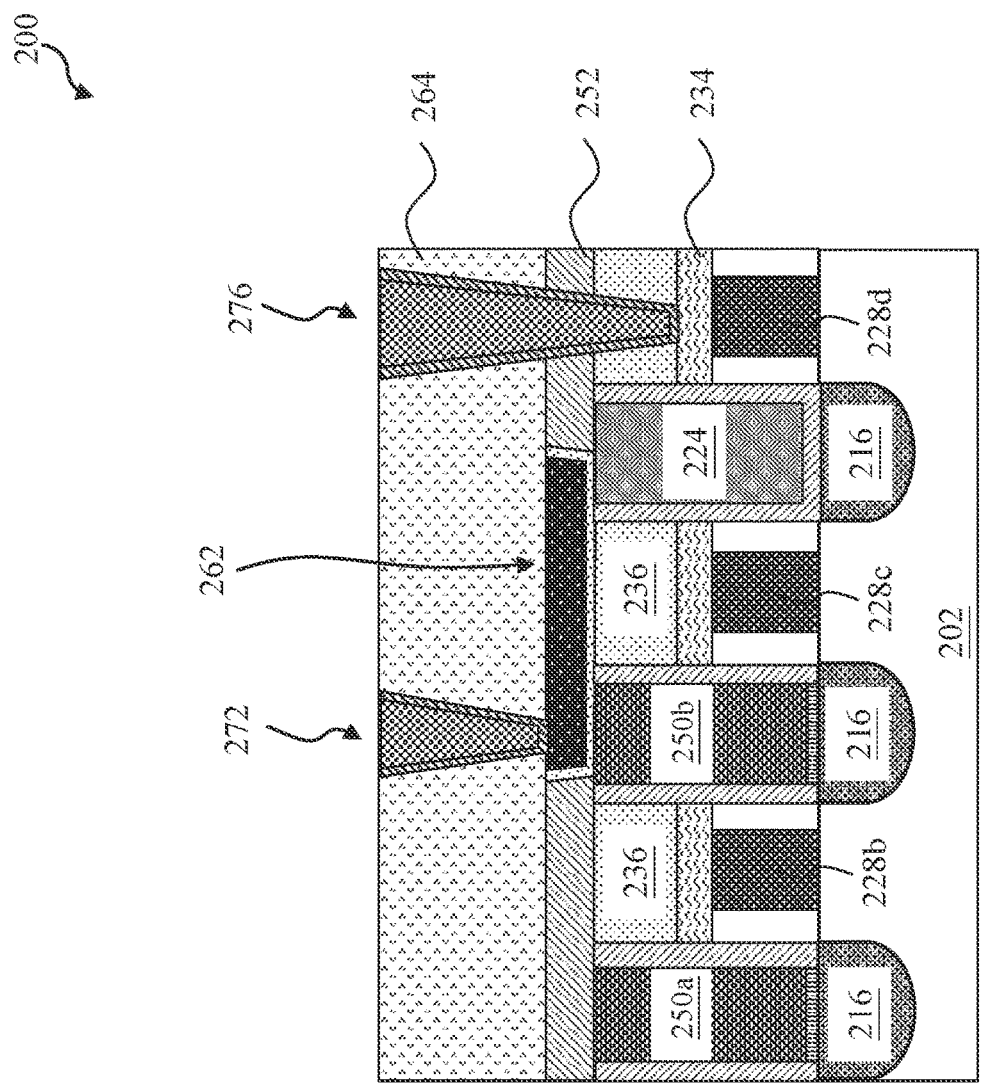
FIG. 22 illustrates a fragmentary cross-sectional view of the second device area taken along line B-B' in FIG. 21, according to various aspects of the present disclosure.

In the above embodiments described with reference to FIGS. 3-20, the metal feature 262 extends along the X direction and is in direct contact with two parallel and adjacent source/drain contacts 250b and 250c spaced apart by the gate structure 228b. To fulfill different circuit design needs, the metal feature 262 may be configured to have different shapes and connect source/drain contacts with different positional relationships. For example, FIG. 21 illustrates a fragmentary layout view of a second device area of the semiconductor device 200. A shape of a top view of the metal feature 262 includes a letter "L" shape. That is, the metal feature 262 includes a first section 262a extending along the X direction and a second section 262b extending along the Y direction. The first section 262a directly contacts a source/drain contact 250b, and the second section 262b directly contacts a source/drain contact 250c. As represented in FIG. 22, the first section 262a is also disposed over the SAC layer 236 and directly contacts at least a portion of the bottom ILD layer 224. The second section 262b may also directly contact at least a portion of the bottom ILD layer 224. Thus, the source/drain feature 216 is spaced apart from the metal feature 262 by the bottom ILD layer 224 and the first CESL 220. It is understood by one of ordinary skill in the art that the shape of a top view of the metal feature 262 may be adjusted to connect source/drain contacts with different positional relationships.

Figure 23:
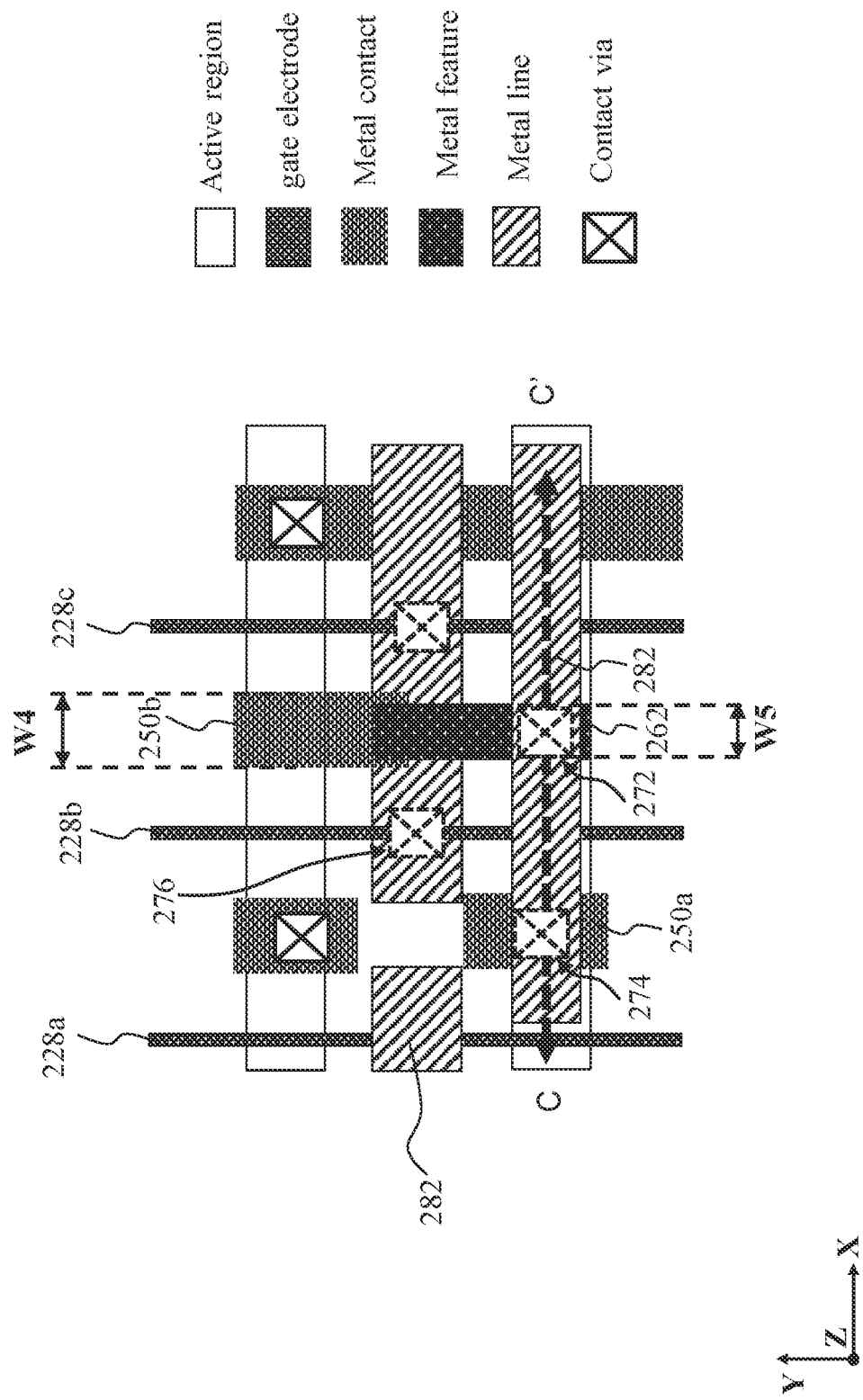
FIG. 23 illustrates a fragmentary layout view of a third device area of the semiconductor device, according to various aspects of the present disclosure.
Figure 24:
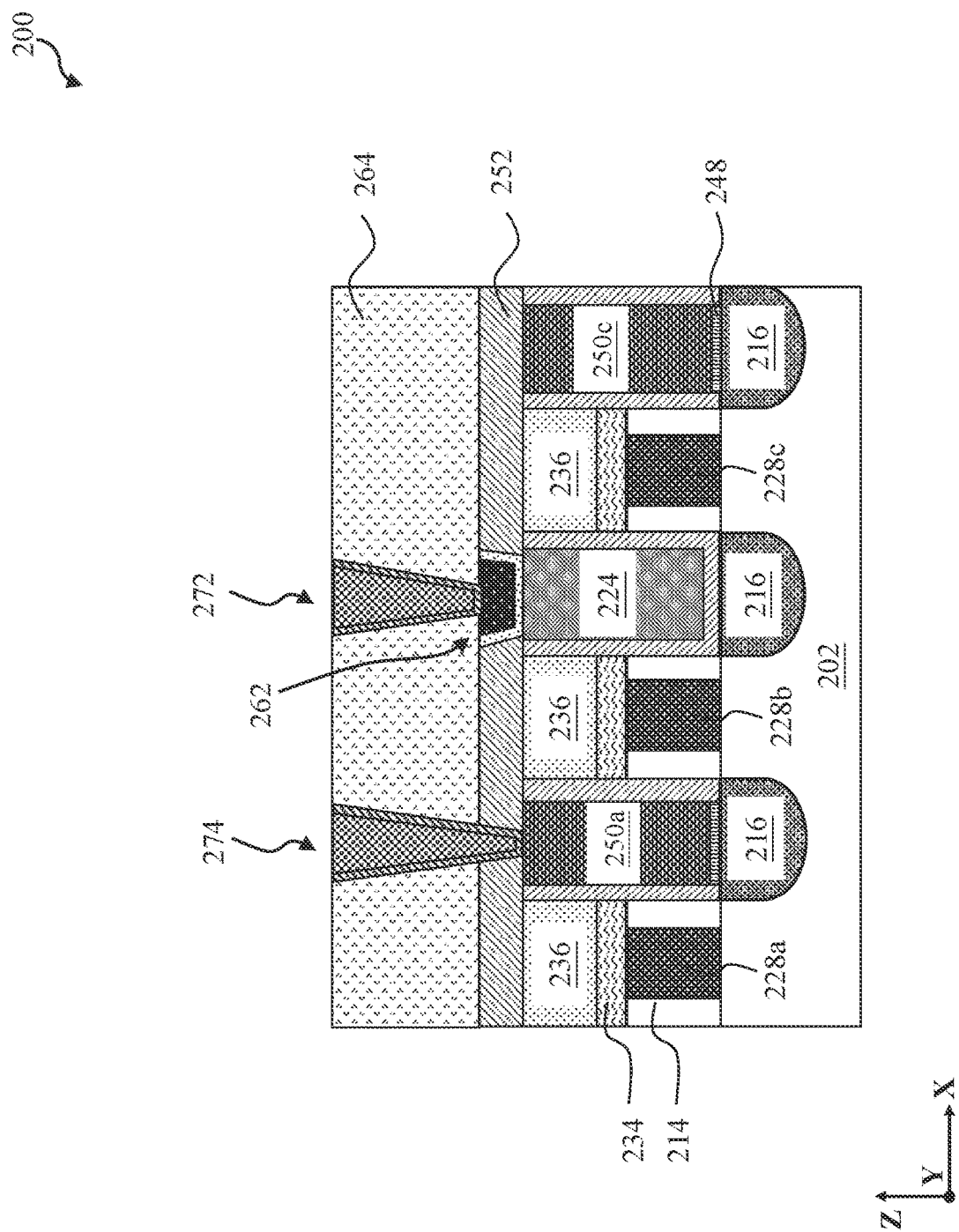
FIG. 24 illustrates a fragmentary cross-sectional view of the third device area taken along line C-C' in FIG. 23, according to various aspects of the present disclosure.

Besides electrically coupling two or more source/drain contacts, the metal feature 262 may extend along the same direction as a corresponding metal contact. For example, as shown in FIG. 23, a source/drain contact 250a is electrically coupled to a metal line 282 by way of a contact via 274. If the source/drain contact 250b is, for example, controlled by a same electric signal travels through the metal line 282, then, without forming a separate metal line directly formed over the source/drain contact 250b and connected to a same terminal to provide the same electric signal, a metal feature 262 which extends along the same direction with the source/drain contact 250b (e.g., along Y direction as shown in FIG. 23) is provided to "lengthen" the source/drain contact 250b and facilitate the electrical connection between the source/drain contact 250b and the metal line 282. In this implementation, a width W5 of the metal feature 262 is less than a width W4 of the source/drain contact 250b to reduce or substantially avoid a leakage current between the adjacent gate contact vias 276 and the metal feature 262. For example, a difference between W4 and W5 may be between about 3 nm and about 8 nm. FIG. 24 illustrates a fragmentary cross-sectional view of the workpiece along line C-C' in FIG. 23. When viewed from the Y direction, the metal feature 262 directly contacts at least a portion of the bottom ILD layer 224, and the source/drain feature 216 is spaced apart from the metal feature 262 by way of the bottom ILD layer 224. Therefore, by providing the metal feature 262, the numbers of metal lines formed over the source/drain contacts may be advantageously reduced.

The present disclosure provides for many different embodiments. Semiconductor structures and methods of fabrication thereof are disclosed herein. An exemplary semiconductor structure includes a first source/drain contact, a second source/drain contact spaced apart from the first source/drain contact by a first gate structure, an etch stop layer (ESL) over the first source/drain contact and the second source/drain contact, a conductive feature disposed in the etch stop layer and in direct contact with the first source/drain contact and the second source/drain contact, a dielectric layer over the etch stop layer, and a contact via extending through the dielectric layer and electrically connected to the conductive feature.

In some embodiments, a top surface of the conductive feature is coplanar with a top surface of the etch stop layer. In some embodiments, the semiconductor structure may also include a self-aligned cap layer over the first gate structure, and the conductive feature may be disposed directly over a portion of the self-aligned cap layer along a direction.

In some embodiments, the conductive feature may include an L shape when viewed along the direction. In some embodiments, the semiconductor structure may also include a capping layer disposed between the first gate structure and the self-aligned cap layer. In some embodiments, the conductive feature may include cobalt, ruthenium, or molybdenum.

In some embodiments, the semiconductor structure may also include a third source/drain contact spaced apart from the second source/drain contact by a second gate structure, and another contact via extending through the dielectric layer and the etch stop layer (ESL) to contact the third source/drain contact. In some embodiments, the semiconductor structure may also include a gate contact via extending through the dielectric layer and the etch stop layer (ESL). The gate contact via may be electrically connected to the first gate structure.

Another exemplary semiconductor structure includes a first metal contact over a first source/drain feature, a first gate structure adjacent the first metal contact, an etch stop layer disposed over the first metal contact and the first gate structure, a metal feature extending through the etch stop layer and electrically connected to the first metal contact, an interlayer dielectric (ILD) layer disposed over the etch stop layer, and a contact via extending through the ILD layer to couple to the metal feature. The metal feature is disposed directly over at least a portion of the first gate structure. In some embodiments, the semiconductor structure may also include a second metal contact over a second source/drain feature, the metal feature may be in direct contact with the second metal contact. In some embodiments, a shape of a top view of the metal feature may include an L shape.

In some embodiments, the semiconductor structure may also include a self-aligned cap layer on the first gate structure. The first gate structure may be disposed between the first metal contact and the second metal contact, and the first gate structure may be spaced apart from the metal feature by the self-aligned cap layer.

In some embodiments, a composition of the etch stop layer may be different from a composition of the self-aligned cap layer. In some embodiments, the semiconductor structure may also include a bottom dielectric layer over a third source/drain feature. The first metal contact may extend through the bottom dielectric layer, and a portion of the metal feature may be disposed directly on the bottom dielectric layer.

In some embodiments, the semiconductor structure may also include a gate contact via extending through the ILD layer and the etch stop layer (ESL). The gate contact via may be electrically connected to the first gate structure. In some embodiments, the semiconductor structure may also include a third source/drain contact over a third source/drain feature, and another contact via extending through the ILD layer and the etch stop layer (ESL) to couple to the third source/drain contact.

A method includes forming a first source/drain contact over a first source/drain feature and a second source/drain contact over a second source/drain feature, depositing an etch stop layer over the first source/drain contact and the second source/drain contact, patterning the etch stop layer to form a conductive feature opening to expose the first source/drain contact and the second source/drain contact, forming a conductive feature in the conductive feature opening, forming a dielectric layer over the conductive feature and the etch stop layer, and forming a contact via extending through the dielectric layer to couple to the conductive feature.

In some embodiments, the forming of the conductive feature may include depositing a conductive material over the etch stop layer to fill the conductive feature opening and performing a planarization process to remove recessive conductive material. After the performing of the planarization process, a top surface of the conductive feature may be coplanar with a top surface of the etch stop layer.

In some embodiments, the patterning of the etch stop layer may include after the depositing of the etch stop layer, depositing an interlayer dielectric (ILD) layer over the etch stop layer and patterning the ILD layer and the etch stop layer to expose the first source/drain contact and the second source/drain contact.

In some embodiments, the method may also include forming a gate structure between the first source/drain feature and the second source/drain feature and forming a self-aligned cap layer on the gate structure. The patterning of the etch stop layer may also expose a portion of the self-aligned cap layer, and the gate structure may be spaced apart from the conductive feature by the self-aligned cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first source/drain contact;
a second source/drain contact spaced apart from the first source/drain contact by a gate structure;
a gate capping layer disposed on the gate structure;
an etch stop layer (ESL) over the first source/drain contact and the second source/drain contact; and
a conductive feature disposed in the etch stop layer and in direct contact with the first source/drain contact and the second source/drain contact,
wherein the conductive feature is vertically spaced apart from a top surface of the gate capping layer.

2. The semiconductor structure of claim 1, wherein the gate capping layer comprises aluminum, tungsten, cobalt, ruthenium, or titanium.

3. The semiconductor structure of claim 1, further comprising:
a first gate spacer and a second gate spacer extending along sidewalls of the gate structure,
wherein the gate capping layer is disposed directly on top surfaces of the first gate spacer and the second gate spacer.

4. The semiconductor structure of claim 3, wherein the first gate spacer and the second gate spacer comprise silicon carbonitride, silicon oxycarbide, silicon oxycarbonitride, or silicon nitride.

5. The semiconductor structure of claim 3, further comprising:
a first contact etch stop layer (CESL) sandwiched between the first source/drain contact and the first gate spacer; and
a second CESL sandwiched between the second source/drain contact and the second gate spacer.

6. The semiconductor structure of claim 5, wherein the first CESL and the second CESL comprise silicon nitride layer or silicon oxynitride.

7. The semiconductor structure of claim 5, the gate capping layer is sandwiched between the first CESL and the second CESL.

8. The semiconductor structure of claim 5, further comprising:
a self-aligned cap layer over the gate capping layer,
wherein the self-aligned cap layer is sandwiched between the first CESL and the second CESL.

9. The semiconductor structure of claim 8, wherein the self-aligned cap layer comprises silicon oxide, silicon nitride, silicon, or silicon carbide.

10. A semiconductor structure, comprising:
a first source/drain contact and a second source/drain contact;
a gate structure disposed between the first source/drain contact and the second source/drain contact along a direction;
a first gate spacer and a second gate spacer sandwiching the gate structure along the direction;
a metal capping layer disposed on top surfaces of the gate structure, the first gate spacer and the second gate spacer;
a self-aligned cap layer disposed on the metal capping layer;
an etch stop layer (ESL) over top surfaces of the first source/drain contact, the self-aligned cap layer and the second source/drain contact; and
a conductive feature disposed in the etch stop layer and in direct contact with the first source/drain contact and the second source/drain contact.

11. The semiconductor structure of claim 10,
wherein top surfaces of the ESL and the conductive feature are coplanar,
wherein bottom surfaces of the ESL and the conductive feature are coplanar.

12. The semiconductor structure of claim 10, wherein a composition of the ESL is different from a composition of the self-aligned cap layer.

13. The semiconductor structure of claim 10,
wherein the conductive feature comprises a barrier layer and a metal fill layer,
wherein the metal fill layer is spaced apart from the ESL by the barrier layer.

14. The semiconductor structure of claim 13,
wherein the barrier layer comprises tungsten, ruthenium, titanium nitride, or tantalum nitride,
wherein the metal fill layer comprises tungsten, ruthenium, cobalt, copper, molybdenum, or an alloy thereof.

15. The semiconductor structure of claim 10,
wherein, along the direction, the first source/drain contact is spaced apart from the first gate spacer, the metal capping layer, and the self-aligned cap layer by a first contact etch stop layer (CESL),
wherein, along the direction, the second source/drain contact is spaced apart from the first gate spacer, the metal capping layer, and the self-aligned cap layer by a second CESL.

16. The semiconductor structure of claim 15, wherein the conductive feature is in directly contact with the first CESL, the self-aligned cap layer and the second CESL.

17. A semiconductor structure, comprising:
an active region comprising a first source/drain region, a second source/drain region and a channel region between the first source/drain region and the second source/drain region;
a gate structure over the channel region;
a first source/drain feature over the first source/drain region;
a second source/drain feature over the second source/drain region;
a first source/drain contact over the first source/drain feature;
a second source/drain contact over the second source/drain feature;
a self-aligned cap (SAC) layer over the gate structure;
a dielectric layer disposed over top surfaces of the first source/drain contact, the second source/drain contact and the SAC layer; and
a local interconnect disposed into the dielectric layer and interfacing the first source/drain contact and the second source/drain contact.

18. The semiconductor structure of claim 17, wherein the top surfaces of the first source/drain contact, the second source/drain contact and the SAC layer are coplanar.

19. The semiconductor structure of claim 17, wherein top surfaces of the local interconnect and the dielectric layer are coplanar.

20. The semiconductor structure of claim 17, wherein a composition of the dielectric layer is different from a composition of the SAC layer.

* * * * *